United States Patent [19]
Schramm

[11] Patent Number: 5,812,601
[45] Date of Patent: Sep. 22, 1998

[54] CODING FOR HIGHER-LEVEL MODULATION

[75] Inventor: Peter Schramm, Erlangen, Germany

[73] Assignee: Telefonaktiebolaget LM Ericsson, Stockholm, Sweden

[21] Appl. No.: 749,229

[22] Filed: Nov. 15, 1996

[51] Int. Cl.$^6$ .................................................. H03M 13/00
[52] U.S. Cl. ........................ 375/262; 375/264; 375/265; 375/286; 375/298; 375/341; 371/37.01; 371/43.2; 371/43.3; 371/43.8
[58] Field of Search ................................. 375/260–262, 375/264, 265, 286, 298, 340, 341; 371/37.01, 37.04, 43.9, 43.2, 43.4, 43.6, 43.8

[56] References Cited

U.S. PATENT DOCUMENTS

| | | |
|---|---|---|
| 5,113,401 | 5/1992 | Chevillat et al. . |
| 5,408,499 | 4/1995 | Sasaki ..................................... 375/286 |
| 5,548,615 | 8/1996 | Wei ......................................... 375/281 |
| 5,666,370 | 9/1997 | Ganesan et al. ..................... 371/37.01 |

FOREIGN PATENT DOCUMENTS

| | | |
|---|---|---|
| 0 490 552 A2 | 6/1992 | European Pat. Off. . |
| 0 634 856 A2 | 1/1995 | European Pat. Off. . |

OTHER PUBLICATIONS

Akio Aoyama, et al., "Performance of Bit–Interleaved Trellis Coded 16–QAM with Maximized Code Diversity", IEICE Transactions on Fundamentals of Electronics, Communications and Computer Sciences, vol. E78–A, No. 9, Sep. 1995, Tokyo, Japan, pp. 1215–1219.

Hanan Herzberg, et al., "Concatenated Multilevel Block Coded Modulation", IEEE Transactions on Communications, vol. 41, No. 1, Jan 1993, New York, U.S., pp. 41–49.

Jung–Fu Cheng, et al., "Complexity–Reduced Multilevel Coding with Rate–Compatible Punctured Convolutional Codes", Proceeding of the Global Communications Conference 1993, Nov. 29, 1993 — Dec. 2, 1993, New York, U.S., pp. 814–818.

Biglieri, et al., "Introduction to Trellis–Coded Modulation with Applications", 1991, Macmillan, New York, U.S., Chapter 10.

Yosef Kofman et al., "A Multilevel Coded Modulation Scheme for Fading Channels", AEÜ, vol. 46 (1992) No. 6, pp. 420–428.

Jun Du et al., "Trellis Coded 16–QAM for Fading Channels", ETT, vol. 4, No. 3 (May–Jun. 1993), pp. 335–341.

John Proakis, Ph.D., P.E., "Efficient Signaling with Coded Waveforms", Digital Communications (second edition), McGraw–Hill Book Company, (1989) pp. 440–475.

Gottfried Ungerboeck, "Channel Coding with Multilevel/Phase Signals", IEEE Transactions on Infomration theory, vol. IT–28, No. 1, Jan. 1982, pp. 55–67.

Hideki IMAI et al., "A New Multilevel Coding Method Using Error–Correcting Codes", IEEE Transactions on Information Theory, vol. IT–23, May 1977, pp. 371–377.

(List continued on next page.)

*Primary Examiner*—Don N. Vo
*Assistant Examiner*—Amanda T. Le
*Attorney, Agent, or Firm*—Burns, Doane, Swecker & Mathis, L.L.P.

[57] ABSTRACT

Source symbols are encoded for use in a higher level modulator by partitioning the source symbols into a number of classes. This principle is applied in a number of alternative transmitter and receiver embodiments. In one embodiment, a corresponding encoder is provided for each of the classes, and for each class, each of the source symbols is supplied to the corresponding encoder. For each encoder, coded symbols are supplied at an encoder output and the coded symbols are partitioned into a number of levels associated with the corresponding class, wherein at least one of the classes has at least two levels assigned to it. The partitioned coded symbols are then supplied to a mapper that generates amplitude coefficient signals. Corresponding receivers perform inverse operations to those performed by the transmitters.

42 Claims, 24 Drawing Sheets

OTHER PUBLICATIONS

Christian Schlegel et al., "Bandwidth Efficient Coding for Fading Channels: Code Construction and Performance Analysis", IEEE Journal on Selected Areas communications, (1989) pp. 1356–1368.

Gottfried Ungerboeck, "Trellis–Coded Modulation with Redundant Signal Sets Part I: Introduction", IEEE Communications Magazine, Feb. 1987 — vol. 25, No.2, pp. 5–11.

Gottfried Ungerboeck, "Trellis–Coded Modulation with Redundant Signal Sets Part II: State of the Art", IEEE Communications Magazine, Feb. 1987 — vol. 25, No. 2, pp. 12–21.

Ephraim Zehavi, "8–PSK Trellis Codes for a Rayleigh Channel", IEEE Transactions on Communications, vol. 40, No. 5, May 1992, pp. 873–884.

J. Du et al., "New 32–QAM Trellis codes for Fading Channels", Electronics Letters, Sep. 30, 1993, vol. 29, No. 20, pp. 1745–1746.

Andrew Viterbi et al., "A Pragmatic Approach to Trellis–Coded Modulation", IEEE Communications Magazine Jul. 1989, pp. 11–18.

J. Bibb Cain et al., "Punctured Convolutional Codes of Rate (n–1) in and Simplified Maximum Likelihood Decoding", IEEE Transactions on Information Theory, vol. IT–25, No. 1, Jan. 1979, pp. 97–100.

Joachim Hagenauer, "Rate–Compatible Punctured Convolutional Codes (RCPC Codes) and their Applications", IEEE Transactions on Communications, vol. 36, No. 4, Apr. 1988, pp. 389–400.

A. R. Calderbank, "Multilevel Codes and Multistage Decoding", IEEE Transactions on Communications, vol. 37, No. 3, Mar. 1989, pp. 222–229.

Udo Wachsmann et al., "Power and Bandwidth Efficient Digital Communication Using Turbo Codes in Multilevel Codes", ETT, vol. 6 — No. 5, Sep.–Oct. 1995, pp. 557–567.

G. Caire, et al, "Capacity of Bit–Interleaved Channels", Electronics Letters, Jun. 6, 1996, vol. 32, No. 12, pp. 1060–1061.

Johannes Huber, "Multilevel–Codes: Distance Profiles and Channel Capacity", ITG–FACHBERICHT 130, pp. 305–319, Oct. 1994, (Conf. Record).

J. Huber et al., "Capacities of Equivalent Channels in Multilevel Coding Schemes", Electronics Letters, Mar. 31, 1994, vol. 30, No. 7, pp. 557–558.

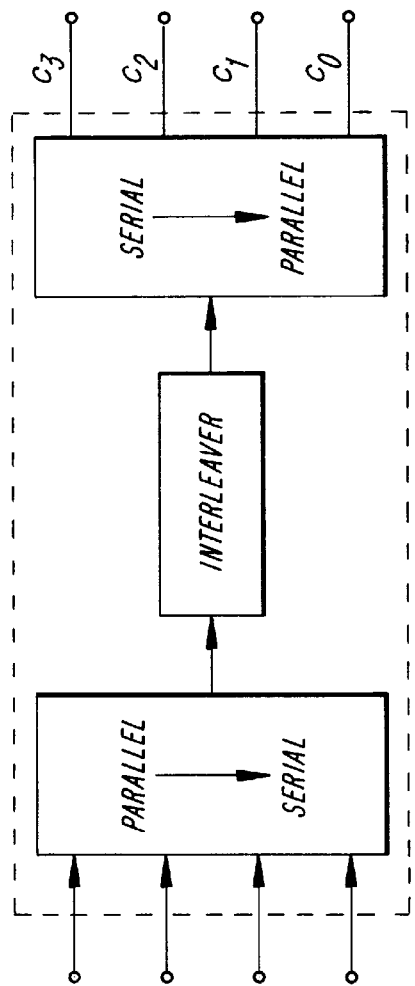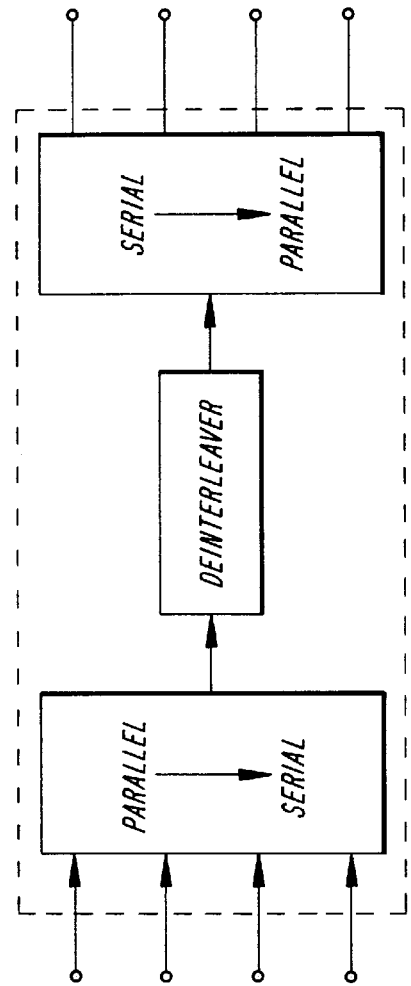

CODING FOR HIGHER-LEVEL MODULATION

BACKGROUND

The present invention relates to digital communication, and more particularly to coding techniques for use with higher-level modulation.

Higher-level modulation (HLM) is a useful technique for providing high data rates in a given frequency band. In this context, HLM means linear modulation techniques, such as M>4-ary phase-shift keying (PSK), M>4-ary quaternary amplitude modulation (QAM), or M≧4-ary (base-band) pulse amplitude modulation (PAM). Here, the letter "M" denotes the number of modulation levels, which is identical to the number of amplitude coefficients in the signal set of the modulation scheme. Since the publication of two fundamental papers (i.e., H. Imai, S. Hirakawa, "A new Multilevel Coding Method Using Error Correcting Codes," IEEE TRANS. ON INFORMATION THEORY, IT-23, pp. 371–377, May 1977; and G. Ungerboeck, "Channel Coding with Multilevel/Phase Signals," IEEE TRANS. ON INFORMATION THEORY, IT-28, pp. 55–67, January 1982), it has become known that channel coding for HLM has to be considered in conjunction with the modulation scheme to achieve an acceptable performance. That is, unlike the situation for 2PSK and 4PSK with Gray mapping (see J. G. Proakis, DIGITAL COMMUNICATIONS, 2nd Ed., McGraw-Hill, N.Y., 1989), the design of codes for use with HLM cannot be done separately from the design of the modulation.

HLM is already frequently used in voiceband modems in order to yield high data rates. By contrast, only binary or quaternary modulation schemes are applied in currently implemented mobile radio systems such as Global System for Mobile Communication (GSM), Digital Advanced Mobile Phone System (D-AMPS (IS-54)), and the Personal Digital Cellular System (PDC). Spectral efficiency (bit/sec/Hz/cell) of cellular radio systems is approximately retained or even increased by using a HLM technique such as, for example, 8PSK or 16QAM instead of 2PSK or 4PSK. Thus, HLM has the two advantages of first retaining or even increasing spectral efficiency, and second providing higher data rates on each link.

For purposes of explanation, this discussion addresses digital communication over mobile radio channels. It should be emphasized, however, that every invention in the field of HLM and channel coding for HLM may be very important not only in the context of mobile radios, but for many other areas of digital communications as well. Thus, the focus on mobile radios is not intended to limit the scope of the invention in any way.

A general transmission scheme is presented in FIG. 1. In particular, FIG. 1 focuses on the base-band processing elements. Further elements of the transmitter 101 and of the receiver 103 (e.g., mixers, antennas, etc.) are modelled within the communication channel 105 in its equivalent baseband representation.

The transmitter 101 comprises one or more channel encoders, and a mapper for generating the amplitude coefficients which are fed into a pulse shaping filter in order to generate the continuous-time signal. The receiver 103 comprises a demodulator and one or more decoders. The metric computation for the decoding is based on the demodulator output signal taking into account the specific mapping scheme. In mobile radio systems, interleaving is used in order to improve the effect of channel coding on the system performance. Depending on the coding scheme, one or more interleavers and deinterleavers are used in the transmitter 101 and receiver 103, respectively.

The transmitted signal is disturbed by additive noise and interference from other users. This interference and noise is usually modelled as a white Gaussian process with zero mean which is independent of the signal (additive white Gaussian noise). Furthermore, the transmitted signal may be distorted due to time dispersion in the radio channel. This effect may be compensated for in the receiver 103 by using a demodulator that comprises an appropriate receiver input filter, a sampling unit, and an equalizer. If the transmission channel is non-dispersive, the demodulator comprises a matched filter and a sampling unit. For both cases of non-dispersive and dispersive channels, the coding (including mapping) and decoding schemes are the same.

For purposes of explanation, this discussion addresses digital communication in the context of non-spread spectrum systems. However, it will be understood that every invention in the field of HLM and channel coding for HLM may be important not only for these systems, but also for spread spectrum communication. Therefore, these inventions may also be used in code division multiple access (CDMA) systems which are based on spread spectrum communication.

The modifications of the transmission system in FIG. 1 for adapting to spread spectrum communication are apparent to those of ordinary skill in the art. Pulse shaping and the demodulator are replaced by a spreading unit and a rake receiver, respectively. Furthermore, the demodulator may be based on joint detection or interference cancellation methods. Again, the method of coding and decoding is not affected by the choice of modulation and demodulation schemes.

The following discussion considers coding schemes for HLM. Thus, the only parts of the transmitter 101 which are considered further are the encoding, the interleaving, and the mapping parts. Similarly, the further addressed receiver parts are the units for deinterleaving and decoding (including metric computation).

The mapping is based on either binary source symbols (bits) or channel encoder output symbols. $\log_2$ (M) of these source/encoder symbols are grouped in order to yield the index of the amplitude coefficient which is selected in order to be fed into the pulse shaping filter. There exist several mapping schemes. The two most important ones are depicted in FIGS. 2a and 2b for the exemplary case of 16QAM. The first, shown in FIG. 2a, is Gray mapping, which is the conventional scheme for uncoded transmission. The second, depicted in FIG. 2b, is proposed by Ungerboeck in G. Ungerboeck, "Channel Coding with Multilevel/Phase Signals," IEEE TRANS. ON INFORMATION THEORY, IT-28, pp. 55–67, January 1982; G. Ungerboeck, "Trellis-Coded Modulation with Redundant Signal Sets—Part I: Introduction," IEEE COMMUNICATIONS MAGAZINE, Vol. 25, no. 2, pp. 5–11, February 1987; and G. Ungerboeck, "Trellis-Coded Modulation with Redundant Signal Sets—Part II: State of the Art," IEEE COMMUNICATIONS MAGAZINE, Vol. 25, No. 2, pp. 12–21, February 1987. Ungerboeck introduced this set partitioning and optimized the convolutional codes for trellis-coded modulation (TCM) based on the resulting mapping as shown in FIG. 2b. This latter mapping scheme will henceforth be referred to as "Ungerboeck mapping" in the following.

Until the fundamental work by Imai et al. (published in the above-referenced Imai et al. article) and Ungerboeck (published in G. Ungerboeck, "Channel Coding with Multilevel/Phase Signals," IEEE TRANS. ON INFORMATION THEORY, IT-28, pp. 55–67, January 1982), the design of channel codes was done independently of the modulation scheme. For example, convolutional codes were designed in order to achieve maximum free Hamming distance. For 2PSK and 4PSK with Gray mapping, this approach leads to communication systems with maximum power efficiency. This is described, for example, in the above-referenced book by J. G. Proakis. However, the independent design of channel coding and modulation may no longer result in efficient communication systems if HLM is used. Instead, the design of an HLM technique makes it is necessary to consider both coding and modulation in conjunction with one another.

The two best known approaches for jointly designing coding and modulation are proposed in the above-referenced articles by Imai et al., and Ungerboeck. These approaches are called trellis-coded modulation (TCM) and multilevel coding (MLC), respectively. A general name for jointly designed coding and modulation schemes is "coded modulation."

The original work by Imai et al. and Ungerboeck dealt with transmission over time-invariant channels. Many researchers have subsequently done a lot of work in this area, and many papers have appeared. One of the more recent focuses concerns transmission over fading channels. However, almost all proposals for channel coding for HLM are based on the original work by Imai et al. and Ungerboeck. An alternative coding scheme for transmission over fading channels has been described in E. Zehavi, "8-PSK Trellis Codes for a Rayleigh Channel," IEE-COM. Vol. 40, No. 5, pp. 873–884, May 1992.

The referenced coding schemes are described in the following discussion.

In the following, the term "code" shall be used to particularly mean a suitable channel code. This code may be, for example, a block or convolutional code. The reason for this clarification derives from the fact that it is common to also refer to the overall scheme comprising one or more channel codes and the mapping as a "code," which leads to the names of the schemes TCM, MLC, and the like.

Trellis-Coded Modulation (TCM)

If channel coding is used in combination with HLM, optimization requires that both the modulation and the channel coding be considered in combination (i.e., they may not be considered independently of one another). Otherwise, the loss due to the code redundancy may be higher than the coding gain.

One tool for combining coding and modulation is the set partitioning (SP) technique introduced by Imai et al. and Ungerboeck in the publications referenced above. FIG. 3 illustrates the derivation of the mapping for an exemplary 16QAM type of modulation in accordance with the SP technique. The idea is that with each binary symbol $c_i$, $i=0, \ldots, \log_2(M)-1$, the signal set is split in order to increase the Euclidean distance between the signal points contained in each subset by increasing symbol index i. An error in the lower levels is more probable than an error in the higher levels. Therefore, the lower levels have to be protected more by channel coding than the higher levels. This set partitioning strategy is the common idea of the two coding schemes proposed by Imai et al. and Ungerboeck.

The two coding schemes by Imai et al. and Ungerboeck differ in their method of code construction. In this section, the discussion will continue with the code construction technique introduced by Ungerboeck. The codes proposed by Imai et al. are called multilevel codes (MLC), and are further discussed below.

An implementation of a transmitter for trellis coded 16QAM (TC16QAM) is shown in FIG. 4. This transmitter can be considered as a combination of a convolutional encoder 401 and a mapper 403. However, the selected convolutional code depends on the chosen mapping scheme. Therefore, the code polynomials for TCM are different from the polynomials of convolutional codes which are optimized for a maximum (free) Hamming distance. In the here-discussed single-symbol TCM (see the original paper by Ungerboeck, 1982), the transmission rate (in terms of bit/symbol) is an integer. The reason for this restriction is that the modulator (mapper) takes only symbols generated by the encoder in a single time step. In so-called "multidimensional TCM", the modulator uses symbols of the encoder from several time steps so that non-integer transmission rates (bit/symbol) are possible.

If the channel is time-varying, interleaving is needed. Since the code is optimized for a given mapping, interleaving can be performed only on a symbol-by-symbol basis, as shown in FIG. 4 by the presence of the interleaver at the output of the mapper 403. Of course, interleaving is not needed for transmission over time-invariant channels. If symbol interleaving is used, however, multidimensional TCM is not feasible. That is, in multidimensional TCM, interleaving can only be applied on multidimensional symbols. Then, the performance of such a scheme would suffer from strongly reduced diversity. Consequently, multidimensional TCM seems to be unattractive for transmission over fading channels.

The inherent restriction of TCM is that only one convolutional code is used. However, this restriction encompasses the case where uncoded source symbols are fed directly into the mapper. These symbols are then left unprotected. The number of lower levels which are generated by the channel encoder may vary and depends, for example, on the number of states of the code. An example of an encoder for 16QAM with two uncoded symbols is shown in FIG. 5. It should be noted that for transmission over fading channels (with interleaving) such uncoded symbols cause a significant performance degradation. As a result, such uncoded symbols should be avoided in optimum codes that are intended for transmission over fading channels.

A TCM scheme (without any interleaving) which provides non-integer transmission rates (bit/symbol) was disclosed in U.S. Pat. No. 5,113,401 to P. R. Chevillat, E. S. Eleftheriou and D.G.U. Maiwald, entitled "Block Coding Scheme for Fractional-Bit Transmission." The feature of non-integer transmission rates is provided by using a signal set that has a number of signal points that is unequal to a power of two. In principle, the coding scheme is the same as depicted in FIG. 5. In order to provide such "expanded" signal sets (compared to the basic set with a number of signal points equal to a power of two) an additional uncoded level is introduced that is not used in each modulation interval. For an efficient transmission by the expanded signal set, an assignment of a frame of source symbols (bits), which correspond to several modulation intervals, to a frame of mapping input symbols (on the uncoded levels) is performed. In the patent of Chevillat et al. cited above, this assignment is called "block coding." However, this "block coding" is not a coding in the sense of error protection, but is instead used for an efficient selection of signal points from a larger signal set.

An exemplary 16QAM TCM receiver structure is shown in FIG. 6. The demodulator output samples (in symbol frequency) are used for metric computation 601. In this unit, usually M decision variables are generated which are fed into the deinterleaver 603. Commonly, the decision variables are the squared Euclidean distances between the received signal point and the M amplitude coefficients which the decoder treats as potentially sent. These decision variables are used in the decoder 605 which, for example, is a Viterbi decoder and performs maximum-likelihood sequence estimation of the source symbols.

Trellis codes have been designed originally for time-invariant channels. (See, for example, the Ungerboeck publications referenced above.) For these channels, maximizing the minimum Euclidean distance is the optimum design criterion. This is not true for transmission over fading channels if channel coding and interleaving are able to introduce time diversity. In this case, effective code length (i.e., the number of symbols of the shortest error event path) is the most important code parameter because it determines time diversity. This is described in C. Schlegel & D. J. Costello, "Bandwidth Efficient Coding for Fading Channels: Code Construction and Performance Analysis", IEEE-JSAC 7, pp. 1356–1368 (1989). Trellis codes for 8PSK, 16QAM, 32QAM for Rayleigh fading channels have been proposed in a number of publications, including the above referenced Schlegel & Costello article, as well as in J. Du, "Trellis Coded 16-QAM for Fading Channels", EUROPEAN TRANSACTIONS ON TELECOMMUNICATIONS (ETT), Vol. 4, No. 3, pp. 101–106, May–June 1993; and in J. Du et al., "New 32-QAM Trellis Codes for Fading Channels," IEE ELECTRONICS LETTERS, Vol. 29, No. 20, pp. 1745–1746, September 1993. The higher the number of modulation levels the more difficult it is to achieve a powerful code. Then, TCM suffers from the fact that only one code is used for all levels. First simulation results of TC32QAM proposed in the above-referenced Du et al. publication demonstrate that TCM is not suitable for modulation schemes with more than 16 levels for transmission over fading channels.

It should be noted that the codes that are optimum for transmission over fading channels are different from those that are optimum over non-varying channels. This fact may lead to a reduced flexibility of TCM for use in mobile radio systems.

A pragmatic approach to TCM has been proposed by Viterbi et al. in a publication entitled "A Pragmatic Approach to Trellis-Coded Modulation," IEEE COMMUNICATIONS MAGAZINE, pp. 11–19, July 1989. The intention here is to use an often used convolutional encoder for HLM where a hardware implementation already exists. The transmitter is as shown in FIG. 5. The code utilized in this case is the standard convolutional code with rate ½ and constraint length 7. See, for example, the above-referenced Proakis publication. Since the symbols in the higher levels are left uncoded in all cases, Gray mapping is used. This pragmatic TCM scheme does not achieve the same asymptotic gain as the Ungerboeck schemes. However, it is acceptable for several applications.

An advantage of TCM is:
  There is only one code and thus only one encoder/decoder pair.

The disadvantages of TCM are:
  Interleaving is performed on a symbol-by-symbol basis. Therefore, time diversity on fading channels is only half that which can be achieved when bit interleaving is possible.
  Code design is not flexible. For example, the transmission rate (bit/symbol) is restricted to be an integer for single-symbol TCM. On the other hand, multidimensional TCM, which would allow non-integer transmission rates (bit/symbol), leads to inferior performance on fading channels.

Multilevel Codes (MLC) with Multistage Decoding (MSD)

The principle of multilevel codes (MLC) for transmission over static channels was originally introduced by Imai and Hirakawa in their above-referenced publication. An exemplary MLC transmitter for 16QAM with symbol interleaving is illustrated in FIG. 7, and an exemplary MLC transmitter for 16QAM with bit interleaving is shown in FIG. 8. In each case, each level is separately encoded. If only block codes are used, this scheme is also called block coded modulation (BCM). However, MLC is not restricted to use with block codes only. Rather, any kind of code can be used in the several levels. In this context, punctured convolutional codes are especially attractive for achieving high rates (bit/symbol). Punctured convolutional codes are described, for example, in J. B. Cain et al. "Punctured Convolutional Codes of Rate (n−1)/n and Simplified Maximum Likelihood Decoding," IEEE TRANS. ON INFORMATION THEORY, vol. IT-25, pp. 97–100, January 1979; and in J. Hagenauer, "Rate-Compatible Punctured Convolutional Codes (RCPC) and Their Applications," IEEE TRANS. ON COMMUNICATIONS, vol. 36, No. 4, pp.389–400, April 1988.

For transmission over fading channels, interleaving should be used. In contrast to TCM, MLC allows two forms of interleaving to be used. The straightforward approach is symbol interleaving which, as described above, can also be used for TCM. An exemplary transmitter for multilevel encoded 16QAM (ML16QAM) with symbol interleaving is shown in FIG. 7.

In contrast to symbol interleaving, bit interleaving has the potential of higher time diversity if channel coding is applied and interleaving is effective (i.e., the channel varies significantly during the interleaver time span). MLC has an advantage over TCM in that bit interleaving can be used by a transmitter. A transmitter implementation of MLC with bit interleaving is shown in FIG. 8. This implementation of MLC has been proposed in Y. Kofman et al., "A Multilevel Coded Modulation Scheme for Fading Channels," AEUE, Vol. 46, No. 6, pp. 420–428, 1993, and seems to be preferable in mobile radio systems.

In FIG. 8, bit interleavers are represented by separate units. For MLC, bit interleaving has to be performed separately on each level. Of course, the interleavers may be viewed as one unit with several inputs and outputs, but in such a unit, the symbols on the levels must not be mixed. The reason for the separation is that decoding is different on each level. Thus, mixing the symbols on different levels by interleaving would destroy the properties of the codes.

The standard approach to decoding of MLC is to use a multistage decoder (MSD). Exemplary receivers for MLC with symbol interleaving and for MLC with bit interleaving are shown in FIGS. 9 and 10, respectively. In the first stage, the code corresponding to level 0 is decoded. The estimated symbols on this level are used for decoding in the next level, and so on. Thus, buffers are needed for these operations.

If bit interleaving is used, a respective deinterleaving of the decision variables and re-interleaving of estimated binary symbols has to be performed on each level, as illustrated in FIG. 10.

There are many papers which discuss the design of MLC schemes which are based on MSD in the receiver. In most of them, the design using a bound on Euclidean distance in each level is proposed. See, for example, A. R. Calderbank, "Multilevel Codes and Multistage Decoding," IEEE TRANS. ON COMMUNICATIONS, COM-37, pp. 222–229, March 1989. However, this technique does not take into account the multiple representation of the signal points in the higher levels. An alternative design proposal is to view the several levels as equivalent channels, and to select the code rate in each level based on channel capacity of the equivalent channels. This design method is described in the above-referenced Kofman et al. publication, in J. Huber, "Multilevel Codes: Distance Profiles and Channel Capacity," ITG-FACHBERICHT 130, pp. 305–319, October 1994 (Conf. Record), or in U. Wachsmann and J. Huber, "Power and Bandwidth Efficient Digital Communication Using Turbo Codes in Multilevel Codes," EUROPEAN TRANSACTIONS ON TELECOMMUNICATIONS (ETT), Vol. 6, No. 5, pp. 557–567, September/October 1995.

An important result discussed in the above-referenced Huber publication as well as in J. Huber and U. Wachsmann, "Capacities of the Equivalent Channels in Multilevel Coding Schemes," IEE ELECTRONIC LETTERS, Vol. 29, No. 20, pp. 1745–1746, March 1994, is the principle that the sum of the capacities of all equivalent channels is equal to the channel capacity provided by the whole signal set. Thus, MSD is an asymptotically optimum decoding scheme (in the limit of infinite codeword length). However, for finite codeword lengths, error propagation inherent to MSD leads to a performance degradation.

Because this principle is very important for discussing the invention later on in this disclosure, it is illustrated by a numerical example which has been calculated following that which is discussed in both the Huber and Wachsmann and the Huber publications. The capacities (bit/symbol) of the equivalent channels for 16QAM are calculated and shown in FIGS. 11a and 11b. The communication channel is assumed to be time-invariant and non-dispersive. The signal is disturbed by additive white Gaussian noise with one-sided power density No. Es denotes the energy per 16QAM symbol. Thus, Es/No is the signal-to-noise ratio. The capacities are depicted for both Ungerboeck mapping (FIG. 11a) and Gray mapping (FIG. 11b). The higher the index of the level, the higher the provided capacity on this level. One important fact is that, when Gray mapping is applied, levels 0 and 1 provide equal capacity with respect to one another, and that levels 2 and 3 provide equal capacity with respect to one another.

As already stated, the sum of the capacities of all levels (capacity sum) is equal to the total capacity of the signal set if MLC with MSD is used. This statement is independent of the mapping scheme. In FIG. 12, the capacity sum for both Ungerboeck and Gray mapping, and the capacity of the signal set are shown. Note that the figure appears to have only one curve in it because the three curves are identical.

The advantages of MLC with MSD are:
Bit interleaving can be used. As a result, time diversity due to channel coding may be twice that which can be obtained for TCM if interleaving is effective.
Code rates on each level may be balanced in a more efficient way than in TCM. This factor may lead to a higher performance for the same complexity.
Transmission rate can be adjusted arbitrarily.

The disadvantages of MLC with MSD are as follows:
The MSD principle causes error propagation. That is, if a symbol is decided incorrectly in one stage, then its use in deciding symbols for subsequent stages can cause additional errors.
There is more than one encoder/decoder pair. Consequently, complexity of the code has to be lower than the single convolutional code for TCM in order to achieve the same total complexity.

Pragmatic Channel Coding for Higher-Level Modulation by Zehavi

A pragmatic approach to channel coding for HLM was proposed in the above-referenced publication by Zehavi. The main idea is to use one convolutional code in combination with bit interleavers on each level and Gray mapping. The transmitter and receiver structure for this strategy is shown in FIGS. 13 and 14, respectively.

The coding scheme is not restricted to use of convolutional coding only; block codes may be applied here as well. Zehavi proposed in particular the use of punctured convolutional codes. In this case, the encoder 1301 in FIG. 13 comprises a low-rate convolutional code (e.g., with rate ½) and a puncturing unit which removes encoder output symbols from the signal fed into the mapper 1303. In the following discussion, the low-rate convolutional code is referred to as the "mother code."

The unit decoder 1401 (see FIG. 14) for the punctured convolutional code comprises an inverse puncturing unit and an appropriate decoder corresponding to the mother code. The inverse puncturing unit inserts a metric which stands for "uncertain decision variable" at those instants where the puncturing unit has removed a symbol at transmitter side.

It should be emphasized that all levels are equally protected, although the several levels provide different channel capacity and thus should be protected by codes with different rates. This fact causes a degradation but this is more than balanced by the higher diversity produced by bit interleaving, so that there is an overall gain compared to TCM with symbol interleaving.

In FIG. 13, the interleavers are shown as separate units. However, in contrast to MLC, only one code is used for all levels for this pragmatic coding scheme. Therefore, the assignment of encoder output symbols to the levels is arbitrary. This means that interleaving may be implemented by one interleaver which may mix the symbols over all levels. This form of interleaving is illustrated in FIG. 15, where another representation of the dashed box of FIG. 13 is depicted. The equivalent statement is true for the respective deinterleaver in FIG. 14. An alternative representation of the deinterleaving shown in the dashed box in FIG. 14 is depicted in FIG. 16.

In the remainder of this disclosure, all groups of interleavers and deinterleavers which may be further represented by units similar to ones shown in FIGS. 15 and 16, respectively, are depicted as enclosed in a dashed box.

The main advantage of Zehavi's pragmatic channel coding scheme is low complexity because only one encoder/decoder pair is used. On the other hand, the main disadvantage is that there is a performance degradation because coding is not optimally adapted to the levels which should be protected unequally.

A disadvantage of Zehavi's pragmatic channel code is that there is a performance degradation because coding is not optimally adapted to the levels which should be protected unequally.

Problem

In the previous discussion, several conventional coding schemes for HLM are described. It is concluded that:

TCM is a very efficient scheme for time-invariant channels. The main advantage is that only one encoder/decoder pair is used. Its main drawback, in the context of mobile radio systems, is that only symbol interleaving (no bit interleaving) can be used.

The potentially better approach in mobile radio systems is MLC. This coding scheme allows optimum rate distribution over the several levels, and also permits bit interleaving on each level. The disadvantage of MLC is that one encoder/decoder pair is used on each level.

A pragmatic coding scheme was proposed by Zehavi where only one encoder/decoder pair combined with bit interleaving on each level is used. However, this method's use of equal protection on each level is not optimum.

The results presented in the literature show that the principle of using more than one encoder/decoder pair combined with bit interleaving on each level provides superior performance compared to TCM. This is true especially in mobile radio systems. The drawback is the increasing complexity by using several codes. The most complex solution is MLC with one code per level. The other extreme is the proposal by Zehavi where only one encoder/decoder pair is used for all levels.

SUMMARY

In accordance with one aspect of the present invention, a plurality of source symbols for use in a higher level modulator are encoded by partitioning the source symbols into a number of classes. A corresponding encoder is provided for each of the classes, and for each class, each of the source symbols is supplied to the corresponding encoder. For each encoder, coded symbols are supplied at an encoder output and the coded symbols are partitioned into a number of levels associated with the corresponding class, wherein at least one of the classes has at least two levels assigned to it. The partitioned coded symbols are supplied to a mapper that generates amplitude coefficient signals.

In another aspect of the invention, a plurality of source symbols that have been modulated in a higher level modulator are decoded by first receiving demodulator output samples. A number of metric computation units are provided in correspondence with a number of levels, and each level is assigned to one of a number of classes. The demodulator output samples are supplied to each of the metric computation units and computed metric signals are generated at an output of each metric computation unit. A corresponding decoder is also provided for each class. The computed metric signals are supplied from each of the metric computation units to the corresponding decoder, and decoded source symbols are generated. In one embodiment of this decoder, at least one of the classes has at least two levels assigned to it.

In another embodiment, a plurality of source symbols that have been modulated in a higher level modulator are decoded by receiving demodulator output samples. A number of metric computation units are provided in correspondence with a number of levels. Each level is assigned to one of a number of classes, wherein at least one of the classes has at least two levels assigned to it. Decoding in this embodiment takes place in stages, with each stage corresponding to one of the classes. Thus, for a first class, the demodulator output samples are supplied to each of the corresponding metric computation units and computed metric signals are generated at an output of each corresponding metric computation unit. A corresponding decoder is provided for each class. For the first class, the computed metric signals are supplied from each of the corresponding metric computation units to the corresponding decoder, and a first set of decoded source symbols is generated. For a second class, delayed demodulator output samples and the first set of decoded source symbols are supplied to each of the corresponding metric computation units and computed metric signals are generated at an output of each corresponding metric computation unit. For the second class, the computed metric signals are supplied from each of the corresponding metric computation units to the corresponding decoder, and a second set of decoded source symbols are generated.

In another aspect of the invention, a plurality of source symbols are encoded for use in a higher level modulator by first supplying the source symbols to an encoder. The encoded symbols are partitioned into a number of classes. A corresponding puncturing unit is provided for each of the classes, and for each class, each of the source symbols is supplied to the corresponding puncturing unit. Puncturing is different in at least two of the puncturing units. For each puncturing unit, punctured coded symbols are supplied at a puncturing unit output and the punctured coded symbols are partitioned into a number of levels associated with the corresponding class. The partitioned punctured coded symbols are then supplied to a mapper that generates amplitude coefficient signals.

In yet another aspect of the invention, a plurality of source symbols that have been modulated in a higher level modulator are decoded by receiving demodulator output samples. A number of metric computation units are provided in correspondence with a number of levels, and each level is assigned to one of a number of classes. The demodulator output samples are supplied to each of the metric computation units and computed metric signals are generated at an output of each metric computation unit. A corresponding inverse puncturing unit is provided for each class. Puncturing is different in at least two of the inverse puncturing units. The computed metric signals from each of the metric computation units are supplied to the corresponding inverse puncturing unit, and inverse punctured metric symbols are generated. The inverse punctured metric symbols are then supplied from each of the inverse puncturing units to a single decoder.

In other aspects of the invention, interleaving and deinterleaving is provided in a number of different ways to accomplish, alternatively, bit interleaving or symbol interleaving.

BRIEF DESCRIPTION OF THE DRAWINGS

The objects and advantages of the invention will be understood by reading the following detailed description in conjunction with the drawings in which:

FIG. 15 depicts a form of interleaving for Zehavi's pragmatic coding scheme;

FIG. 16 depicts an alternative form of deinterleaving for Zehavi's pragmatic coding scheme;

DETAILED DESCRIPTION

Figure 1:
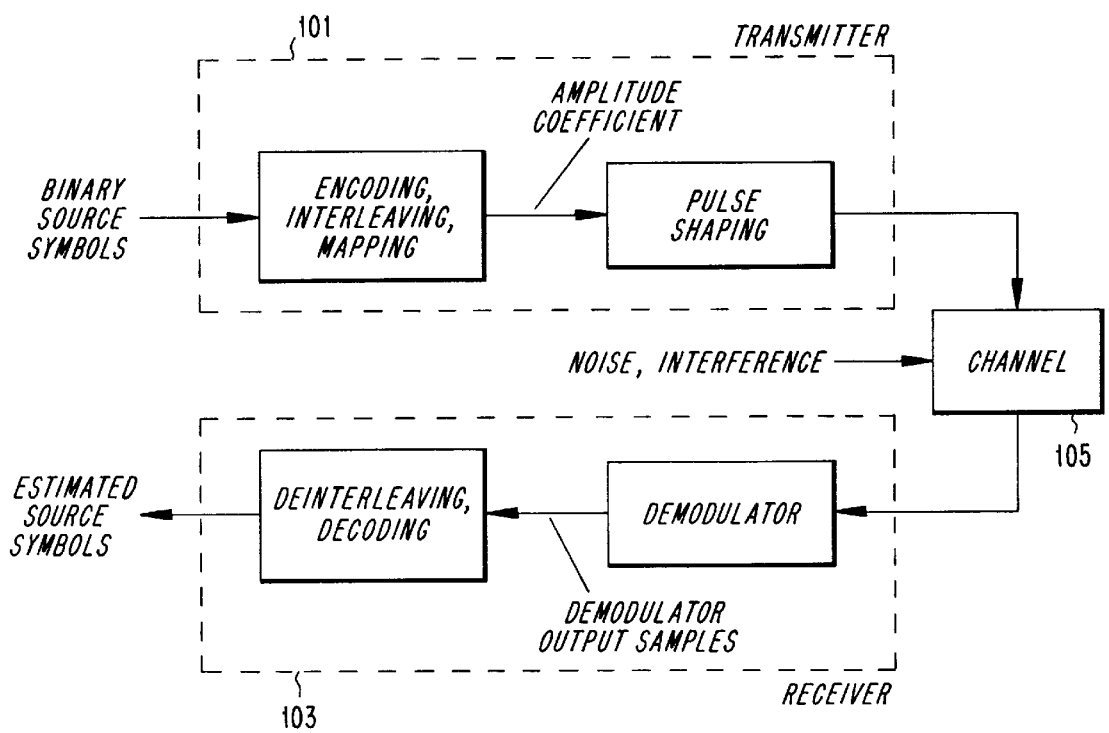
FIG. 1 is a diagram depicting a general transmission scheme.
Figure 2A:
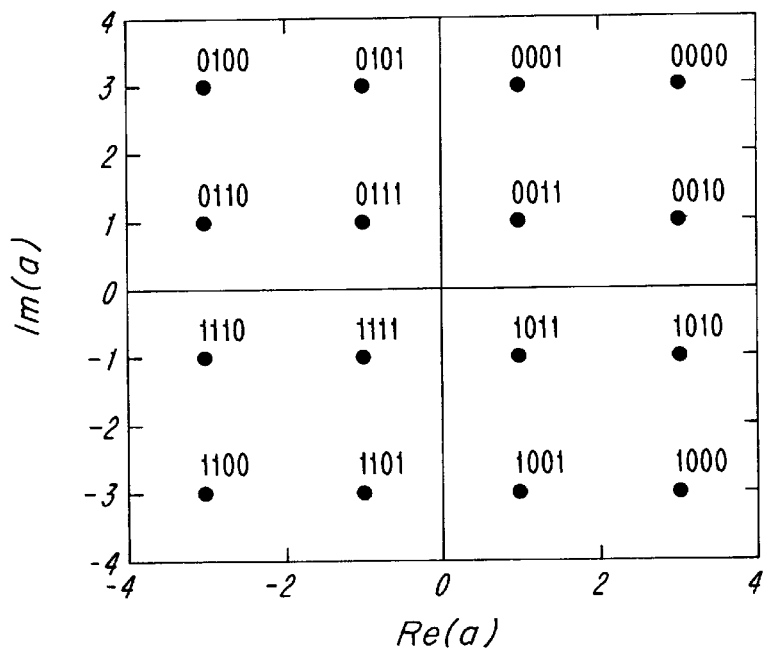
FIGS. 2a and 2b depict Gray and Ungerboeck mapping schemes for the exemplary case of 16QAM.
Figure 2B:
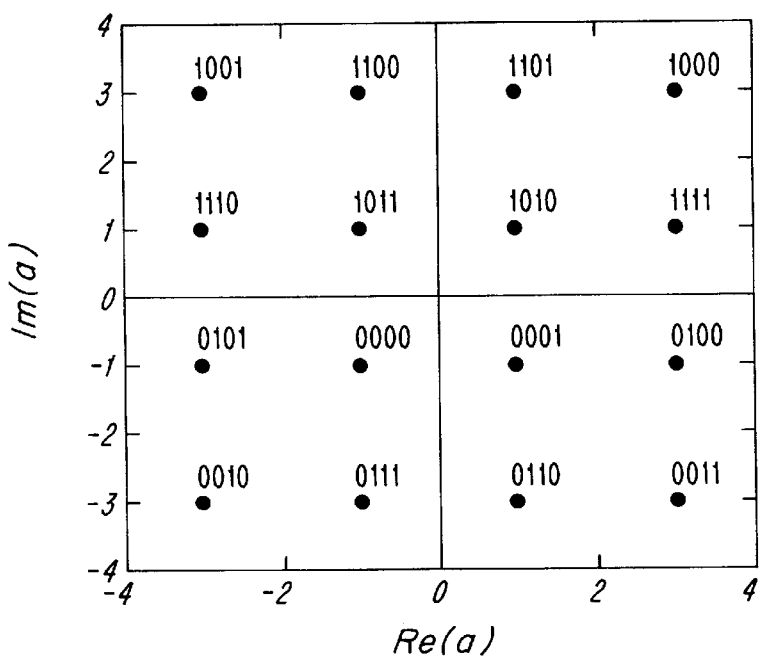
Figure 3:
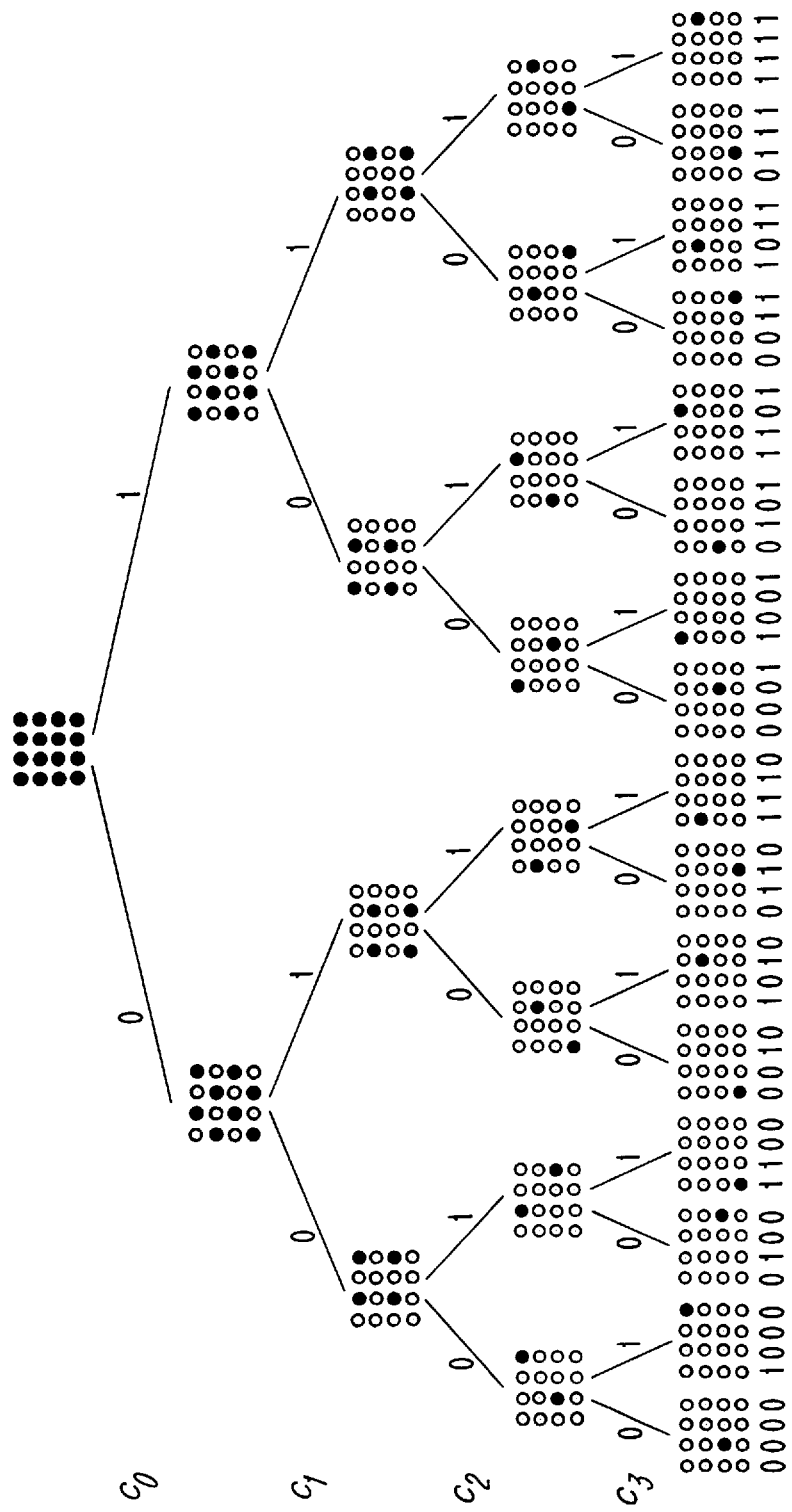
FIG. 3 illustrates the derivation of the mapping for an exemplary 16QAM type of modulation in accordance with the set partitioning technique.
Figure 4:
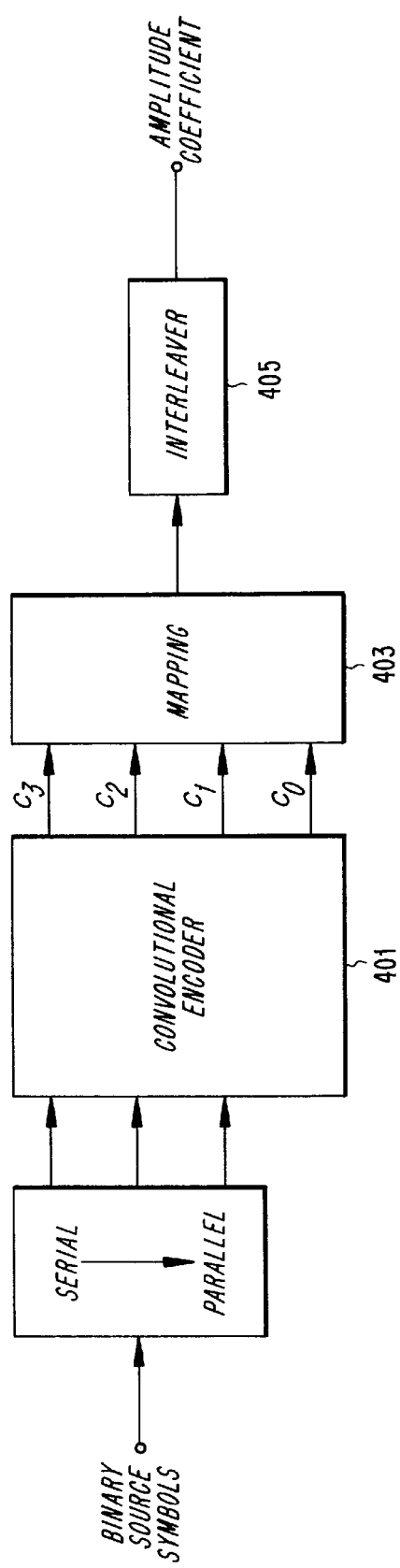
FIG. 4 illustrates an implementation of a transmitter for trellis coded 16QAM.
Figure 5:
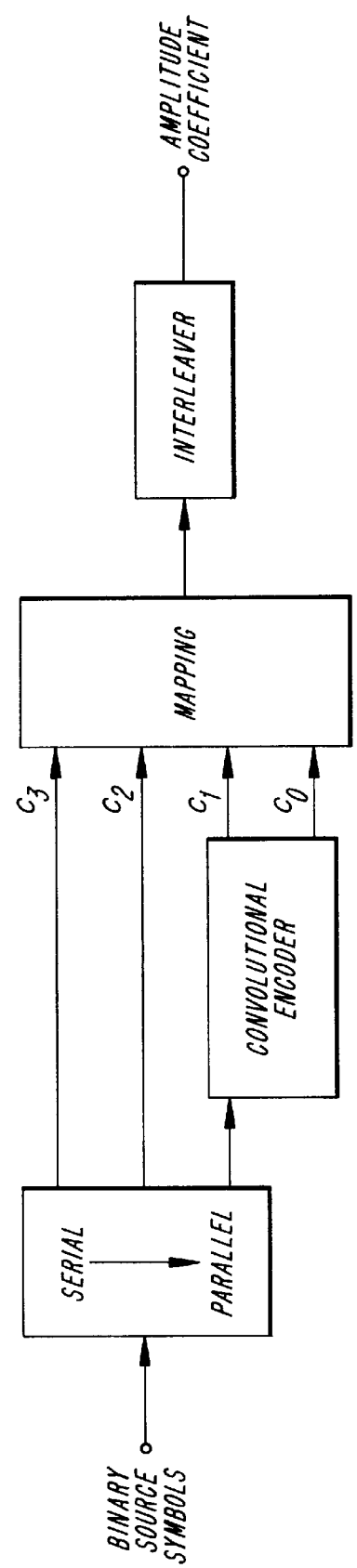
FIG. 5 depicts an example of an implementation of a transmitter for trellis coded 16QAM with two uncoded levels.
Figure 6:
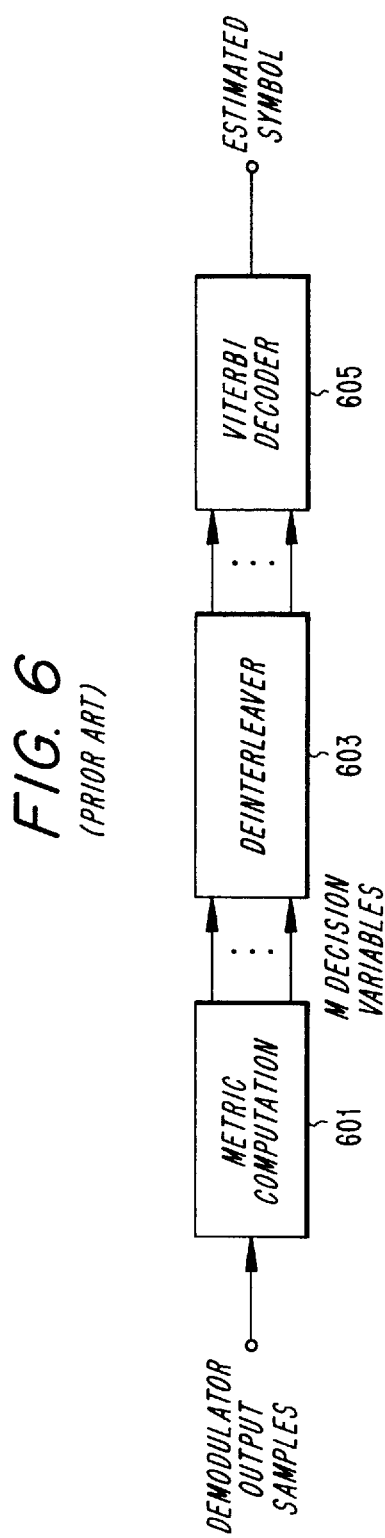
FIG. 6 shows an exemplary receiver structure for trellis coded M-ary modulation.
Figure 7:
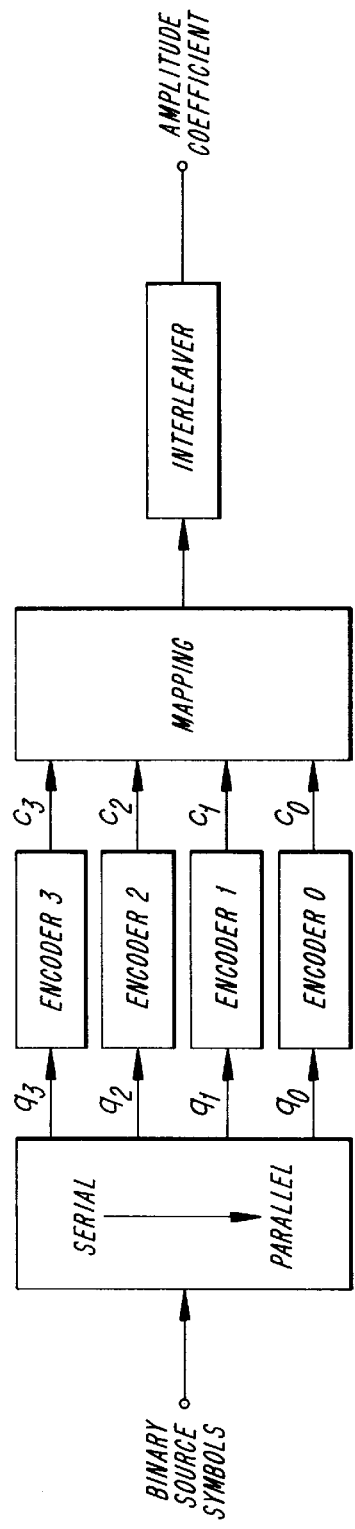
FIG. 7 depicts an exemplary transmitter for multilevel coded 16QAM with symbol interleaving.

The various features of the invention will now be described with respect to the figures, in which like parts are identified with the same reference characters.

As stated in the BACKGROUND section, a communication system based on MLC with MSD could achieve channel capacity. However, in practical applications the feedback in a receiver using MSD may lead to error propagation and thus to some performance degradation. This error propagation can be avoided by decoding the symbols on each level independently from the other levels. In this context, "independent" means that any decisions on symbols on other levels are not used for decoding on the considered level. This principle leads to a transmission scheme which is further called MLC with independent decoding on levels (IDL).

Figure 8:
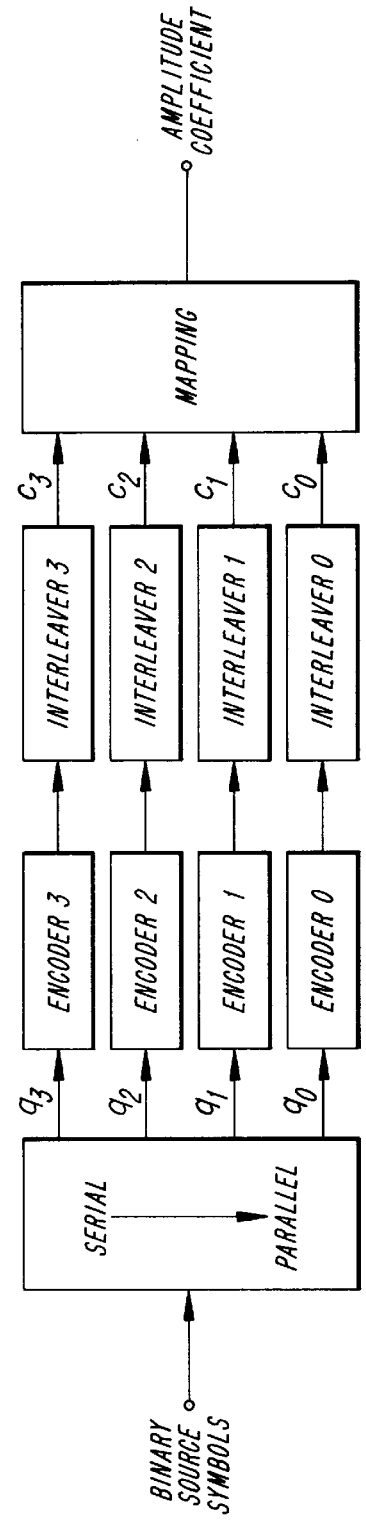
FIG. 8 depicts an exemplary transmitter for multilevel coded 16QAM with bit interleaving.
Figure 9:
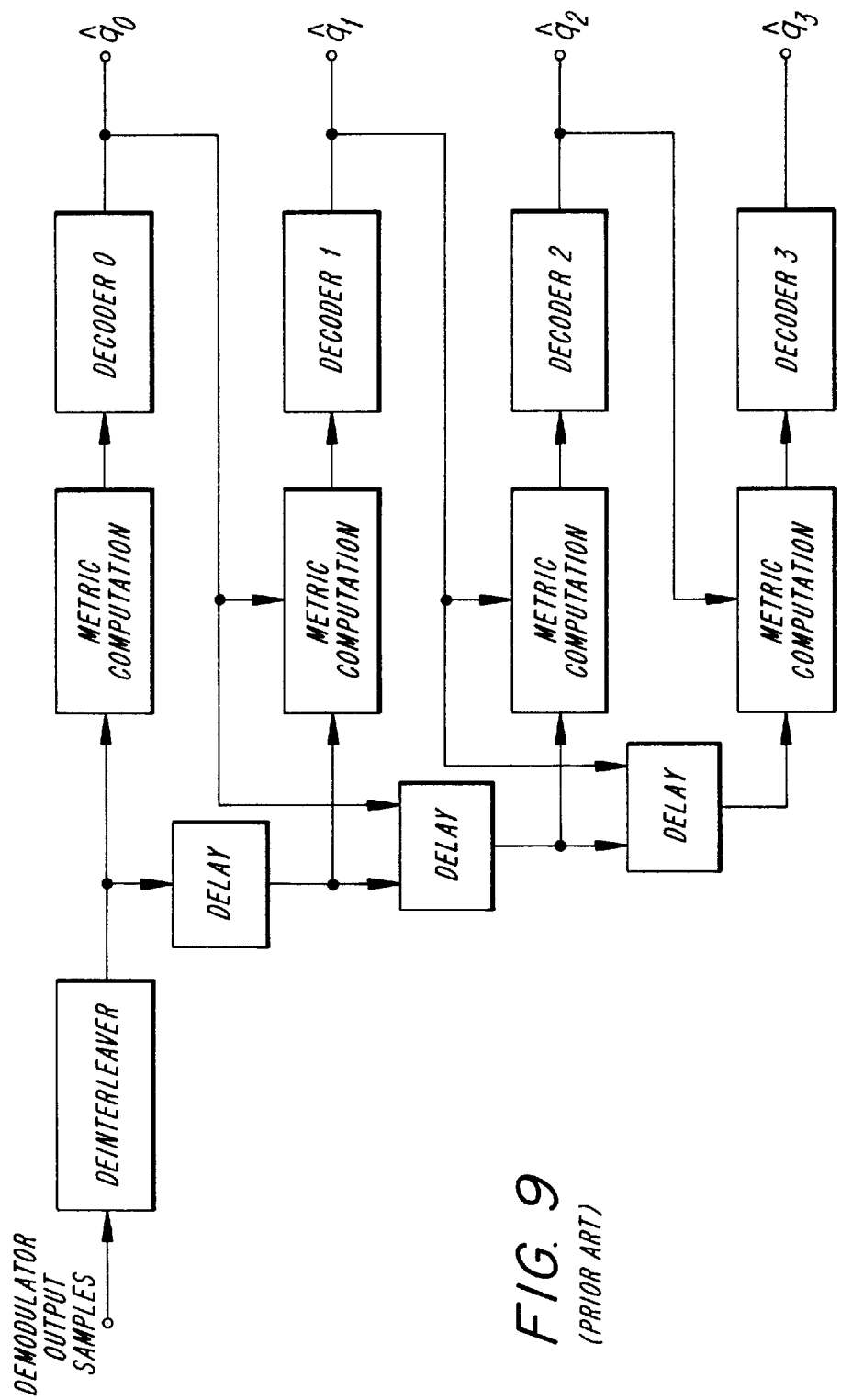
FIG. 9 depicts an exemplary receiver based on multistage decoding for multilevel coded 16QAM with symbol interleaving.
Figure 10:
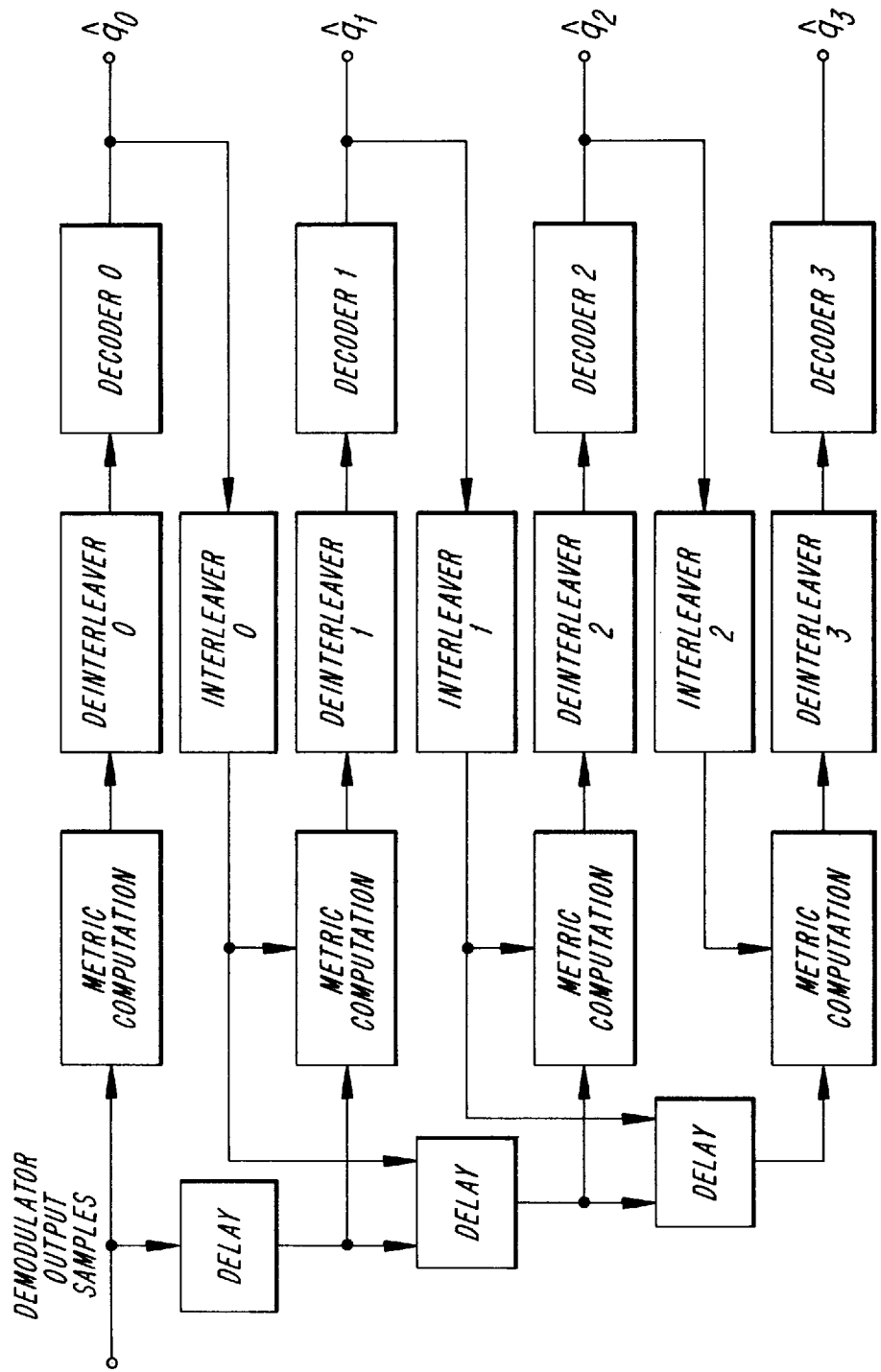
FIG. 10 depicts an exemplary receiver based on multistage decoding for multilevel coded 16QAM with bit interleaving.
Figure 17A:
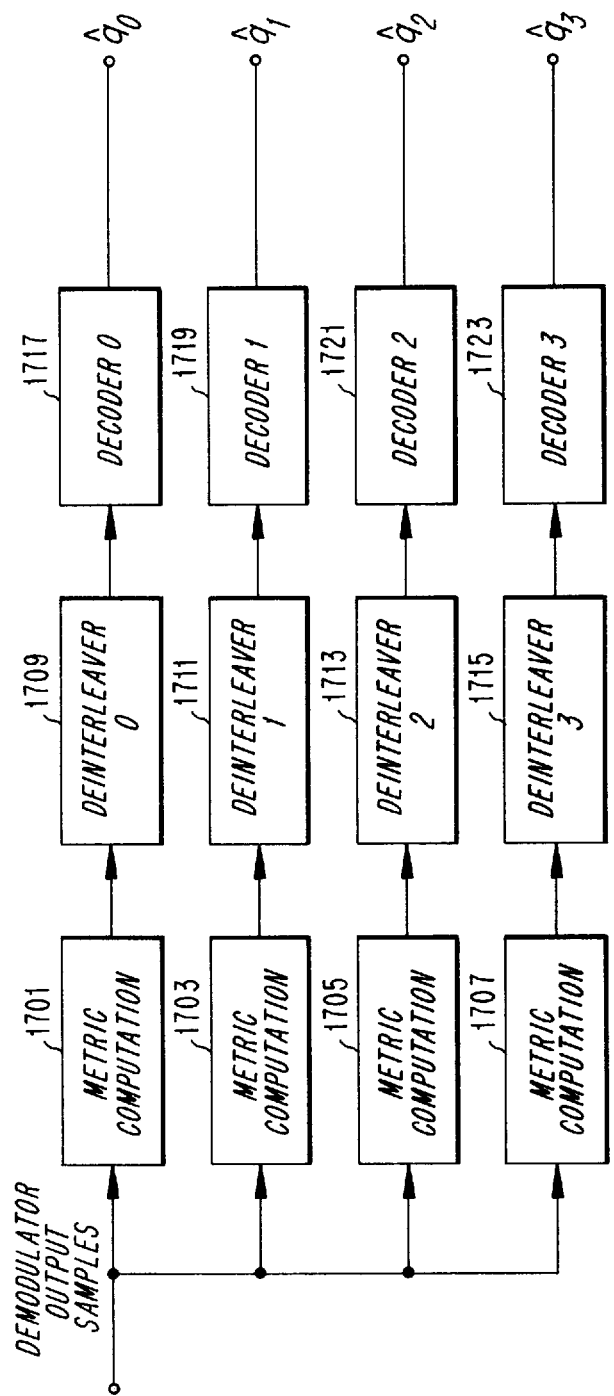
FIG. 17*a* and 17*b* depict several embodiments for independent decoding on levels.

An exemplary transmitter for use in an IDL strategy is shown in FIG. 8. It will be recalled that this same transmitter illustrated the MLC concept as applied to 16QAM. In the receiver, decoding is performed independently on each level as shown in FIG. 17*a*. Here, as stated above, the term "independent" means that any decisions from other levels are not used. Thus, any error propagation and re-interleaving (as discussed in the BACKGROUND section with respect to MSD) is avoided.

In FIG. 17*a*, the receiver for MLC with IDL is shown for the case in which bit interleaving is used. Thus, for each level, a respective one of the metric computation units 1701, 1703, 1705, 1707 supplies computed metrics to a respective one of the deinterleavers 1709, 1711, 1713, 1715, which in turn supplies its output to a respective one of the decoders 1717, 1719, 1721, 1723. Those having ordinary skill in the art will recognize that the metric computation for each level may alternatively be performed within the decoders 1717, 1719, 1721, 1723 themselves, thereby eliminating the need for separate metric computation units 1701, 1703, 1705, 1707. In this case, the receiver can still be considered to provide a number of metric computation units in correspondence with a number of levels.

Each decoder used on a class of levels may be a channel decoder that performs, for example, block or convolutional decoding in correspondence with the type of encoding used on the transmitter side. One or more of these decoders may be a decoder for a punctured convolutional code.

Figure 17B:
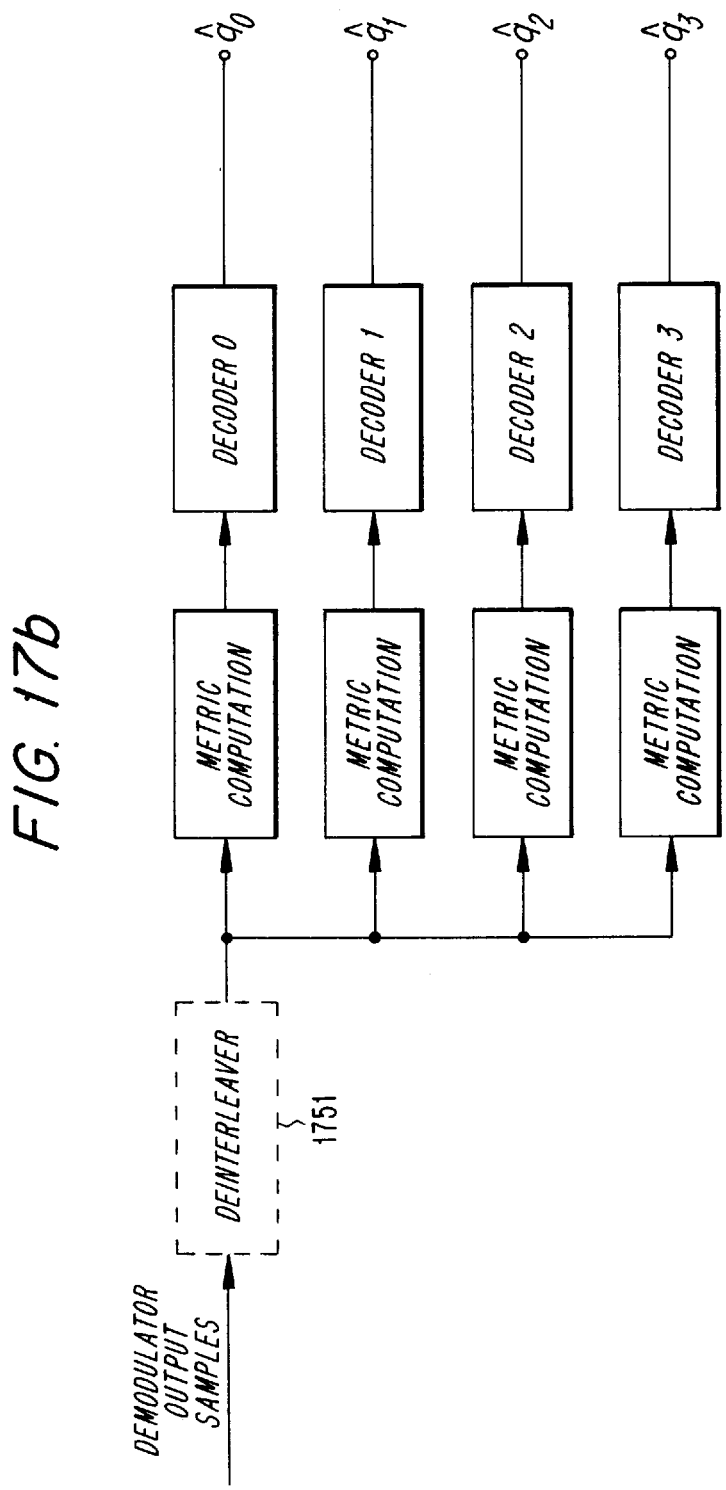

It will be understood that MLC with IDL may also be used in conjunction with symbol interleaving, as shown in FIG. 17*b*. (The dashed line around the deinterleaver 1751 indicates that the presence of the deinterleaver 1751 is optional, so that in yet another embodiment, no deinterleaving is performed.) The necessary modifications for the receiver will be apparent to one of ordinary skill in the art, and thus not stated here.

The receiver based on IDL leads to worse system performance in the sense of channel capacity compared to MSD. However, an analysis of Zehavi's pragmatic coding scheme for HLM, presented in Caire et al., "Capacity of Bit-Interleaved Channels," IEE ELECTRONICS LETTERS, Vol. 32, No. 12, pp. 1060–1061, June 1996, shows that the sum of the capacities of all equivalent channels is reduced only marginally compared to the capacity of the whole signal set if Gray mapping is applied. This result can be applied to MLC with IDL, too.

Figure 11B:
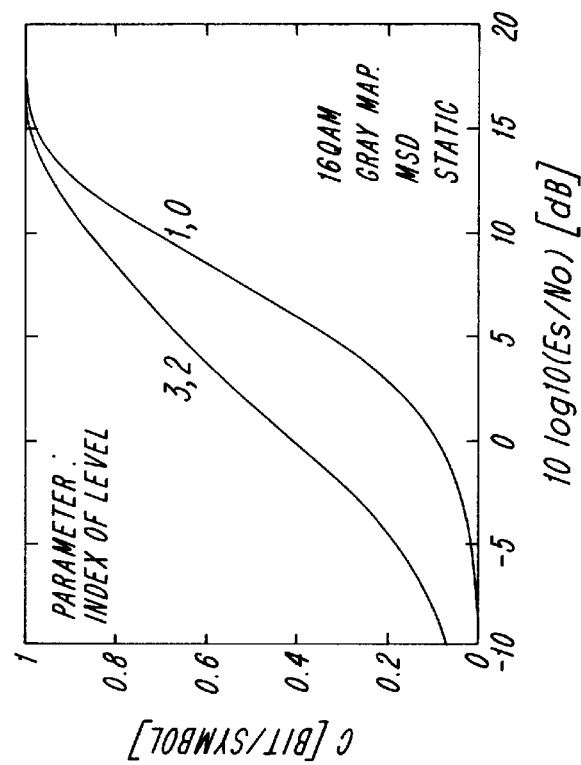
FIGS. 11*a* and 11*b* illustrate the capacities (bit/symbol) of the equivalent channels for multilevel coded 16QAM with multistage decoding.
Figure 11A:
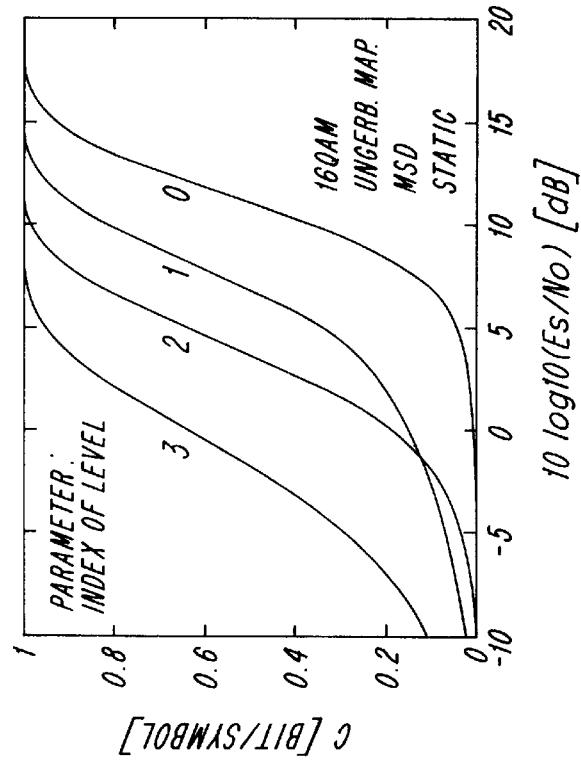
Figure 12:
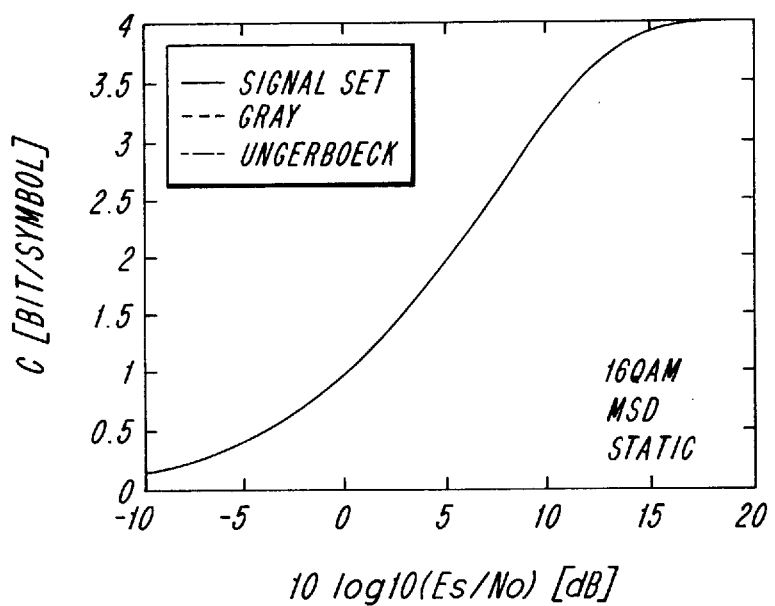
FIG. 12 shows the capacity sum for multilevel coded 16QAM with multistage decoding and both Ungerboeck and Gray mappings, and the capacity of the signal set.
Figure 13:
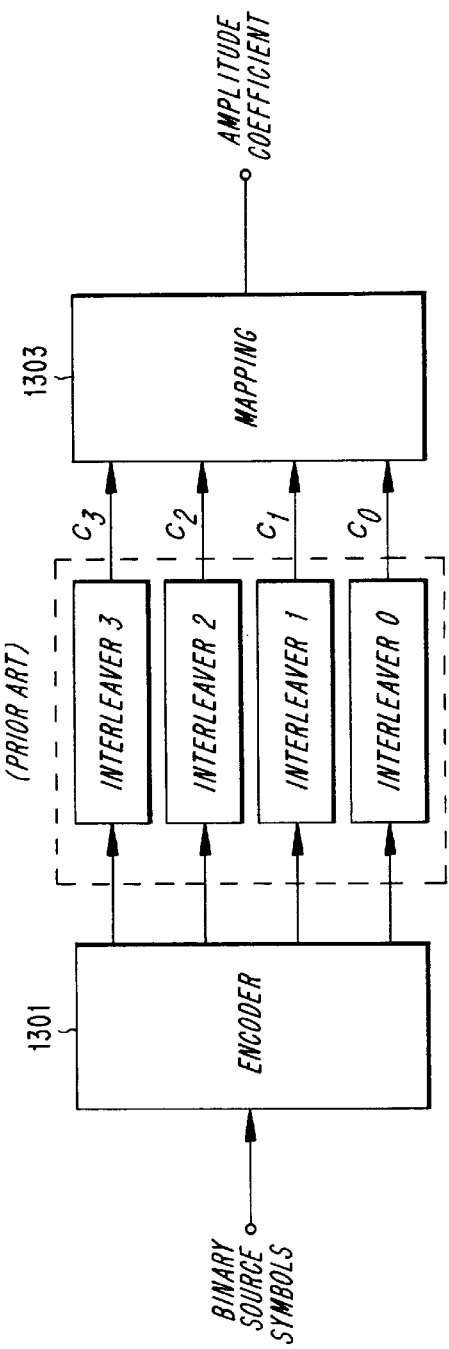
FIG. 13 depicts an exemplary 16QAM transmitter for Zehavi's pragmatic approach to channel coding for higher-level modulation.
Figure 14:
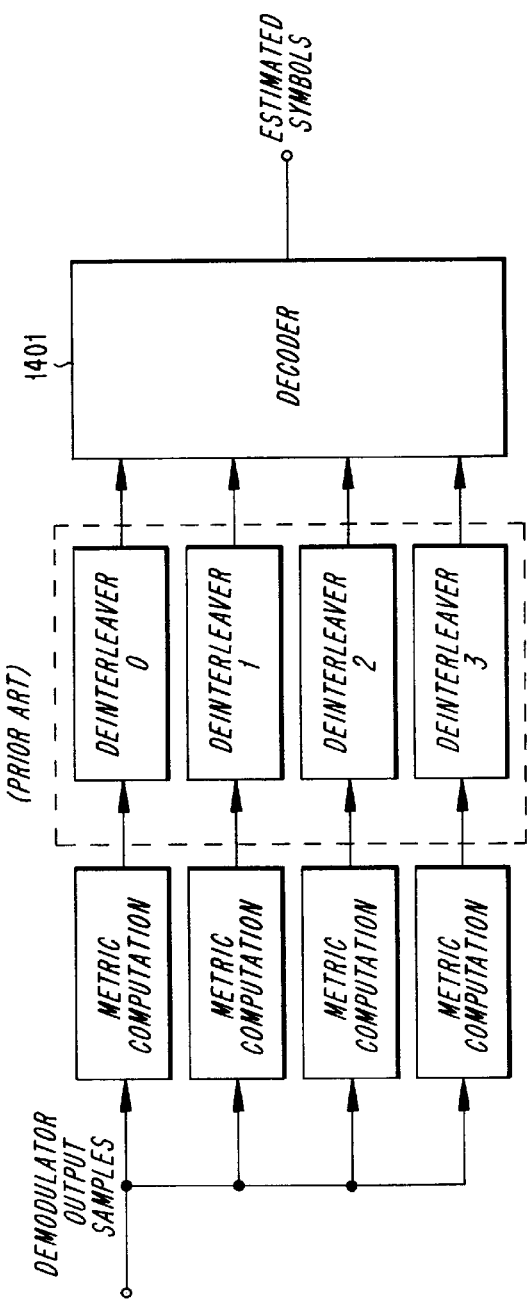
FIG. 14 depicts an exemplary 16QAM receiver for Zehavi's pragmatic approach to channel coding for higher-level modulation.
Figure 18B:
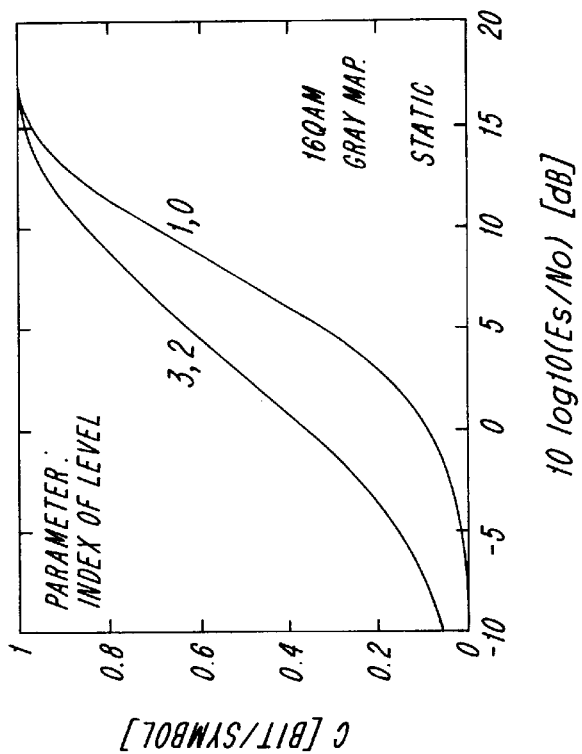
FIGS. 18*a* and 18*b* present the capacities (bit/symbol) of the equivalent channels for multilevel coded 16QAM.
Figure 18A:
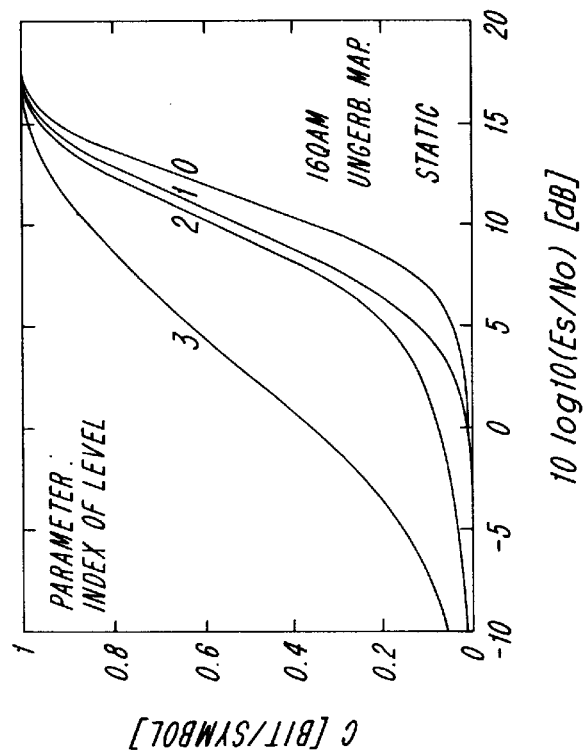
Figure 19:
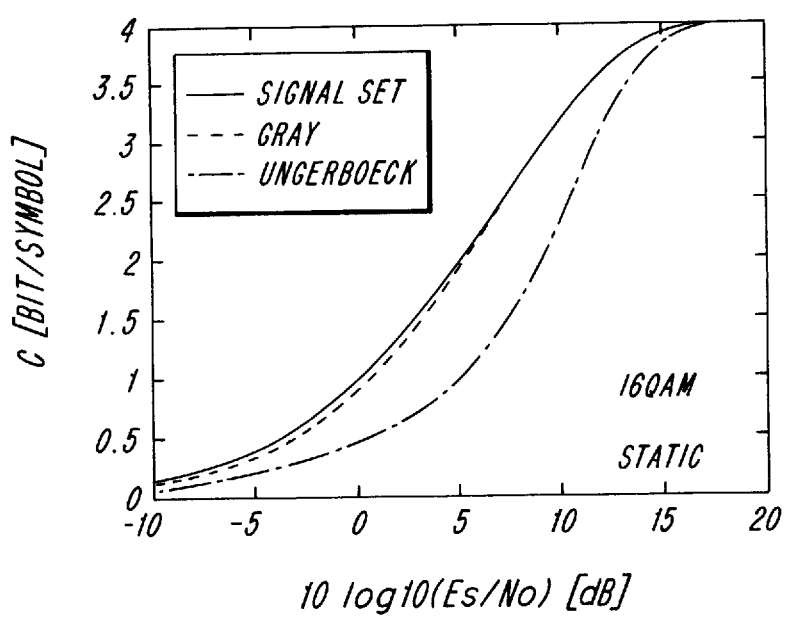
FIG. 19 shows the capacity sum for multilevel coded 16QAM and both Ungerboeck and Gray mapping, and the capacity of the signal set.

Numerical examples for 16QAM are given in FIGS. 18*a*, 18*b* and 19. They are equivalent to the results for MLC/MSD shown in FIGS. 11*a*, 11*b* and 12, respectively. One important principle follows from FIGS. 18*a* and 18*b*, where the capacity sum is compared to the capacity of the signal set. If Ungerboeck mapping is used, capacity sum is significantly less than the capacity of the signal set. In contrast, capacity sum is reduced only marginally compared to the capacity of the signal set if Gray mapping is applied.

Another important principle, which is important for an aspect of the invention that is described below, is that, when Gray mapping is used, levels 0 and 1 provide equal capacity with respect to one another, and that levels 2 and 3 provide equal capacity with respect to one another. This principle is true not only for MLC/IDL, but also for MLC/MSD.

A number of advantages are provided by MLC with IDL. First, bit interleaving can be used. Consequently, time diversity due to channel coding may be twice that which may be obtained for TCM if interleaving is effective. Also, code rate on the levels may be balanced in a more efficient way than in TCM and in Zehavi's pragmatic coding scheme for HLM. This fact may lead to a higher performance for the same complexity. Furthermore, unlike the case with MSD (see the BACKGROUND section), decoding errors do not propagate from one stage to the next. Finally, the transmission rate can be adjusted arbitrarily.

The use of MLC with IDL also has several disadvantages. First, the receiver is suboptimum. However, performance degradation due to suboptimality is expected to be marginal and will be more than balanced by the advantages. Also, there is more than one encoder/decoder pair. Consequently, complexity of the coders and decoders on the several levels has to be lower than that of the single convolutional code for TCM in order to achieve the same total complexity.

In another aspect of the invention, a new coding scheme for HLM appears by considering the capacities of the equivalent channels in FIGS. 11 and 18. It can be seen that, when Gray mapping is used, levels 0 and 1 provide equal capacity with respect to one another, and that levels 2 and 3 provide equal capacity with respect to one another. This is true for MLC with both MSD and IDL. Note that equal capacities for different levels is not limited to the case of Gray mapping, especially if there are more than sixteen amplitude coefficients in the signal set.

The fact that several levels provide equal capacities allows grouping these levels to a class of levels in order to protect the symbols on these levels by the same code. In this way, and in accordance with one aspect of the invention, all levels are divided into classes of levels where each level provides equal (or approximately equal) capacity. Note that channel capacity is not the only criterion for this grouping. Other criteria may be cut-off rate or error exponent. Furthermore, this grouping is not restricted to Gray mapping only. For instance, it may also make sense, in the context of 16QAM with MLC/IDL and Ungerboeck mapping, to divide the levels into two classes where the first class contains levels 0, 1, 2 and the second class contains level 3. This scheme follows from FIG. 18a.

Figure 20:
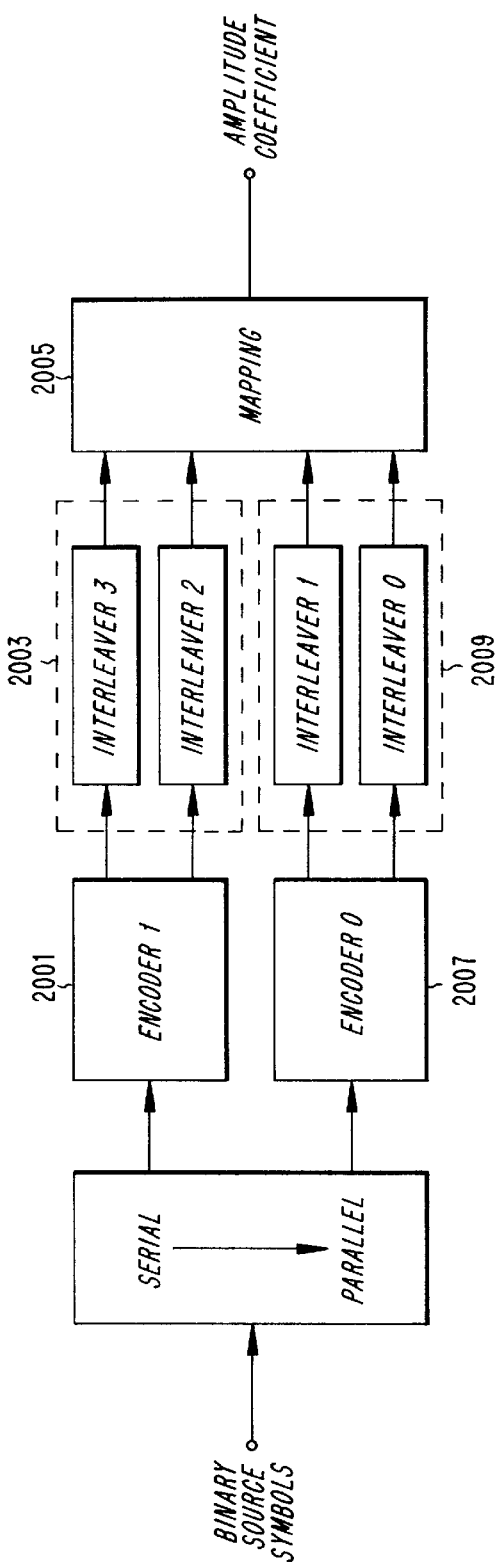
FIG. 20 depicts an exemplary transmitter for 16QAM with multiple class level coding (MCL) in accordance with the invention.

For each of the classes of levels, one code is used for error protection. For each of the classes of levels, the encoder output symbols are supplied as input symbols to a mapper on those levels which correspond to the given class. On each of these output symbol levels, bit interleaving is performed. This scheme will hereinafter be referred to as coding based on multiple classes of levels (MCL code). An exemplary transmitter for 16QAM with MCL coding is depicted in FIG. 20. Although a 16QAM transmitter involves four levels, the four levels have been grouped into two classes, so that the binary source symbols (supplied in serial fashion) are converted into only two groups (i.e., classes) of parallel bits. Each of the two groups is supplied to a respective one of two encoders 2001, 2007. Because each of the two encoders 2001, 2007 corresponds to two of the four possible levels, each supplies two levels of symbols which are supplied to a mapper 2005 alternatively with or without interleaving 2003, 2009.

Of course, MCL coding is not restricted to 16QAM only but may be used for any (M>4)-ary amplitude modulation scheme like PAM, PSK, and QAM.

Each code used on a class of levels may be a channel code like, for example, block or convolutional codes. One or more of these codes may be punctured convolutional codes, which are attractive especially for achieving high rates (bit/symbol).

The bit interleavers 2003, 2009 according to each class of levels have the task of eliminating dependencies not only between the symbols on each level, but also dependencies between the levels in each class. Thus, for practical implementations, the bit interleavers on the levels of one class have to be optimized together due to this criterion. That is, the bit interleavers for each class of levels may be viewed as one unit with several inputs and outputs. This aspect of the invention is illustrated in FIG. 20 by enclosing each class's bit interleavers in a separate dashed box.

Figure 21:
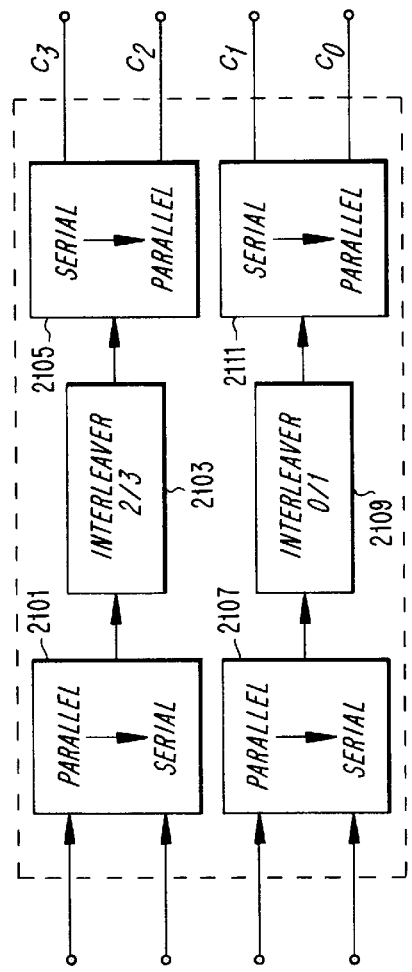
FIG. 21 depicts an alternative representation of interleaving for use with the invention.

An alternative representation of this interleaving is depicted in FIG. 21, where for each class, the parallel output symbols from the encoder are converted into a single serial stream by a respective one of a number of parallel to serial converters 2101, 2107. The single serial stream from each of the parallel to serial converters 2101, 2107 is supplied to a corresponding one of a number of interleavers 2103, 2109. The interleaved bit stream is then supplied to a corresponding one of a number of serial to parallel converters 2105, 2111 whose output is divided into the appropriate number of levels for the corresponding class.

The new MCL coding scheme defines the transmitter side of the communications link. At the receiver side, the principles of both MSD and IDL are usable. However, they have to be adapted to the given coding scheme.

Figure 22:
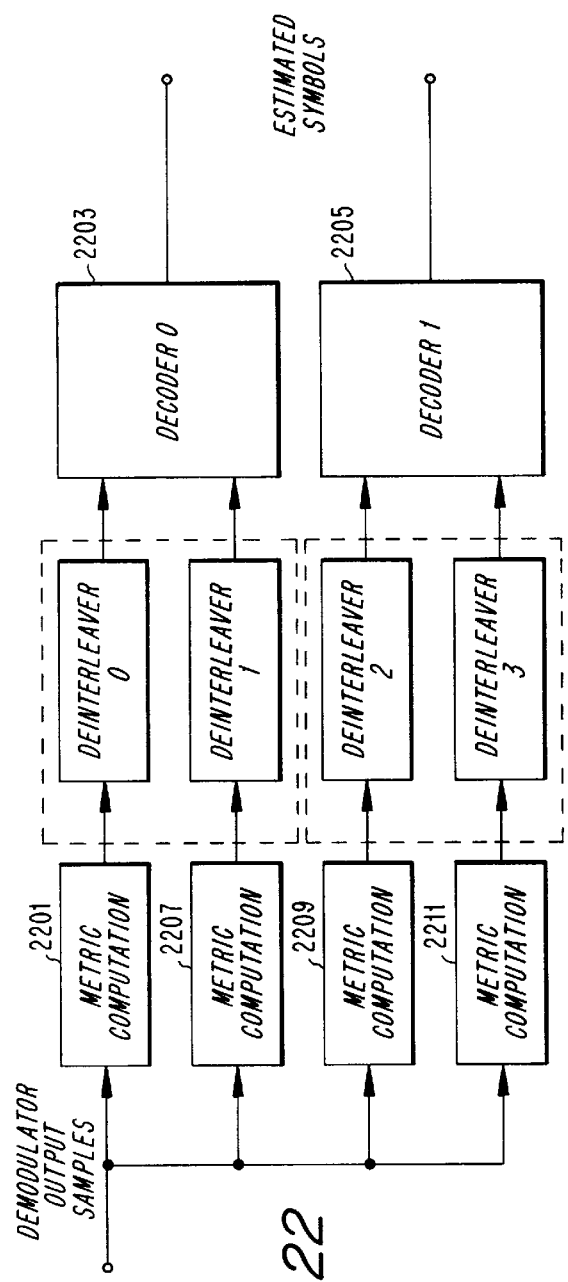
FIG. 22 illustrates a decoding scheme for MCL coded 16QAM in accordance with one aspect of the invention.

The most attractive decoding scheme is based on the IDL principle. An exemplary form of this receiver is shown in FIG. 22. On each level, the metrics for the decoding are computed by metric computation units 2201, 2207, 2209, 2211. These metrics are deinterleaved and fed to the decoder according to the class the level belongs to. For example, in the receiver shown in FIG. 22, levels 0 and 1 are in a first class, so the deinterleaved metrics from both levels are therefore supplied to a first decoder 2203. Similarly, levels 2 and 3 are in a second class, so the deinterleaved metrics from both of these levels are supplied to a second decoder 2205. Each decoder output symbol is used as an estimated source symbol. As with the IDL demodulator shown in FIG. 17b, those having ordinary skill in the art will recognize that the metric computation for each level may alternatively be performed within the decoders 2203, 2205 themselves, thereby eliminating the need for separate metric computation units 2201, 2207, 2209, 2211. In this case, the receiver can still be considered to provide a number of metric computation units in correspondence with a number of levels.

Each decoder used on a class of levels may be a channel decoder that performs, for example, block or convolutional decoding in correspondence with the type of encoding used on the transmitter side. One or more of these decoders may be a decoder for a punctured convolutional code.

Figure 23:
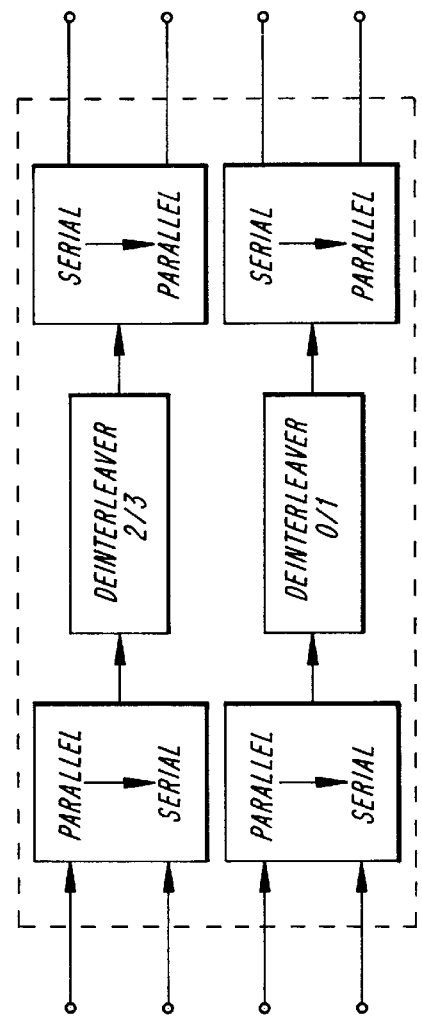
FIG. 23 depicts an arrangement for deinterleaving in accordance with one aspect of the invention.

The interleavers at the transmitter side may be viewed as groups of interleavers, one group for each class of level. In the same way as interleaving on each class of levels may be performed by one interleaver (see, for example, FIG. 21), deinterleaving may be performed equivalently. Such an arrangement for deinterleaving is depicted in FIG. 23. In this exemplary arrangement, the metrics for each class (i.e., potentially the metrics for more than one level) are converted into a single serial data stream, supplied to a single deinterleaver, and converted into a parallel data stream, one for each level.

Figure 24:
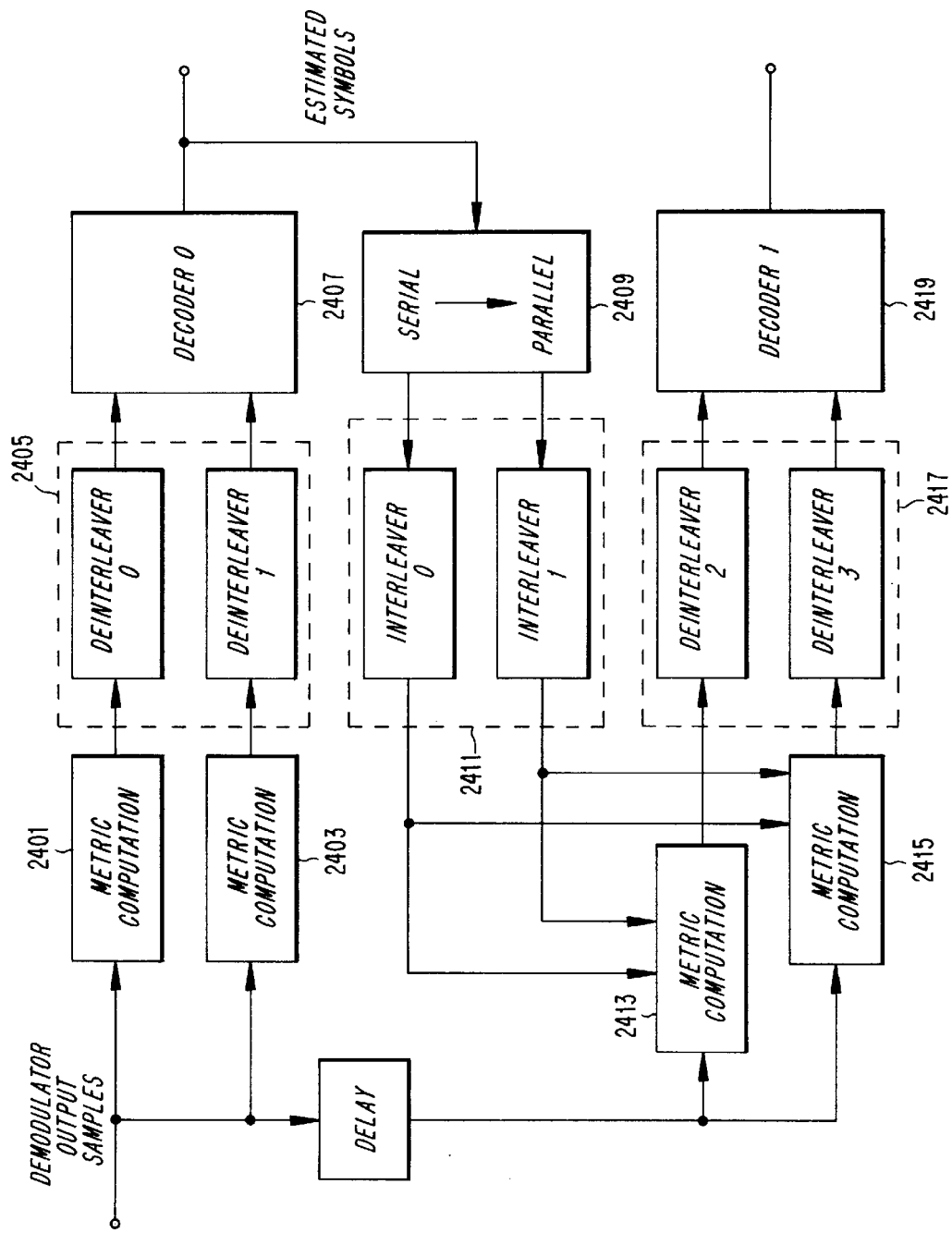
FIG. 24 illustrates an exemplary decoder with feedback for MCL coded 16QAM in accordance with one aspect of the invention.

In an alternative embodiment, a decoder with feedback of estimated symbols on classes of other levels is possible, too. This decoder is equivalent to MSD for MLC. In the decoder with feedback for MCL coding, the output symbols of the decoder for an arbitrary class of levels is fed into the metric computation units of arbitrary other classes of levels. Note that, in accordance with another aspect of the invention, it is not necessary to restrict the feeding of estimated symbols from classes with lower levels to classes with higher levels. Instead, the direction of feeding estimated symbols is arbitrary, especially if mapping schemes other than Ungerboeck are used. An exemplary decoder with feedback for MCL coding is depicted in FIG. 24. It is noted that the presence of bit deinterleaving on each level requires corresponding re-interleaving of symbols that are fed back to a next level. Note that the decoder output signal may comprise not only hard-decided symbols but also soft-decision reliability information. Such signals may be generated by a decoder that performs maximum-a-posteriori symbol-by-symbol estimation.

In the exemplary receiver depicted in FIG. 24, two classes are shown, each with two levels (i.e., a total of four levels are shown). The metric computations for the first two levels are performed by corresponding units 2401 and 2403. These metrics are supplied to corresponding deinterleavers 2405, and two levels of deinterleaved metrics are supplied to a first decoder 2407. The estimated symbols for the first two levels are then used in the process of decoding the symbols for the next two levels by first being converted into a parallel format by a serial to parallel converter 2409, which supplies two levels worth of parallel data. This data is then interleaved by corresponding interleavers 2411. The interleavers 2411 model the interleaving that took place on the transmitter side. The interleaved bit streams are then supplied to third and fourth metric computation units 2413, 2415, which each also received an appropriately delayed copy of the original demodulator output samples. Deinterleavers 2417 and a second decoder 2419 then complete the process of decoding the remaining estimated symbols. As with the IDL demodulator shown in FIG. 17b, those having ordinary skill in the art will recognize that the metric computation for each level within each class may alternatively be performed within the decoders 2407, 2419 themselves, thereby eliminating the need for separate metric computation units 2401, 2403, 2413, 2415. In this case, the receiver can still be considered to provide a number of metric computation units in correspondence with a number of levels.

Each decoder used on a class of levels may be a channel decoder that performs, for example, block or convolutional decoding in correspondence with the type of encoding used on the transmitter side. One or more of these decoders may be a decoder for a punctured convolutional code.

Figure 25:
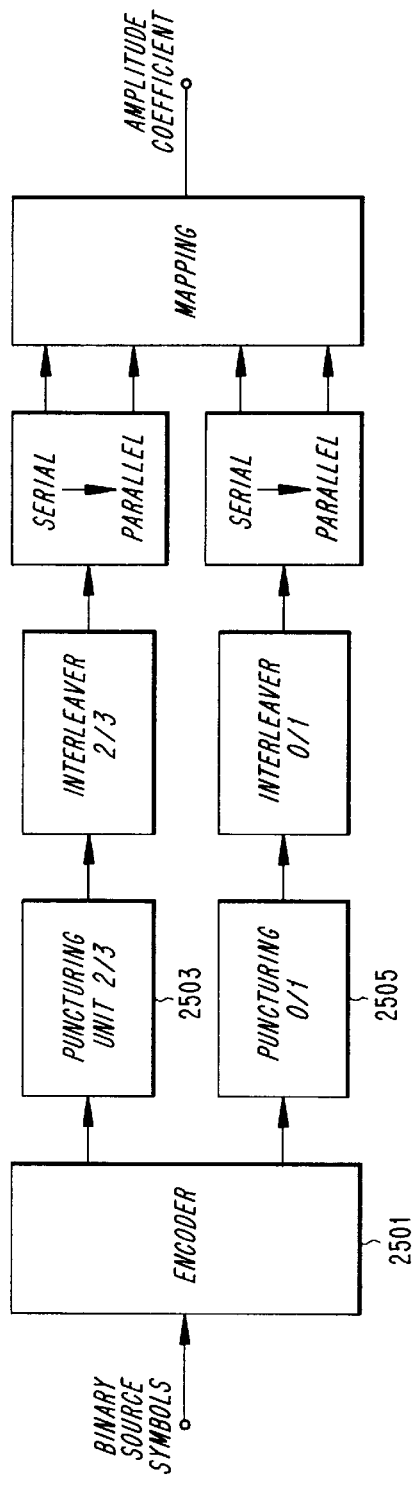
FIG. 25 illustrates an exemplary transmitter for MCL coded 16QAM in accordance with one aspect of the invention.
Figure 26:
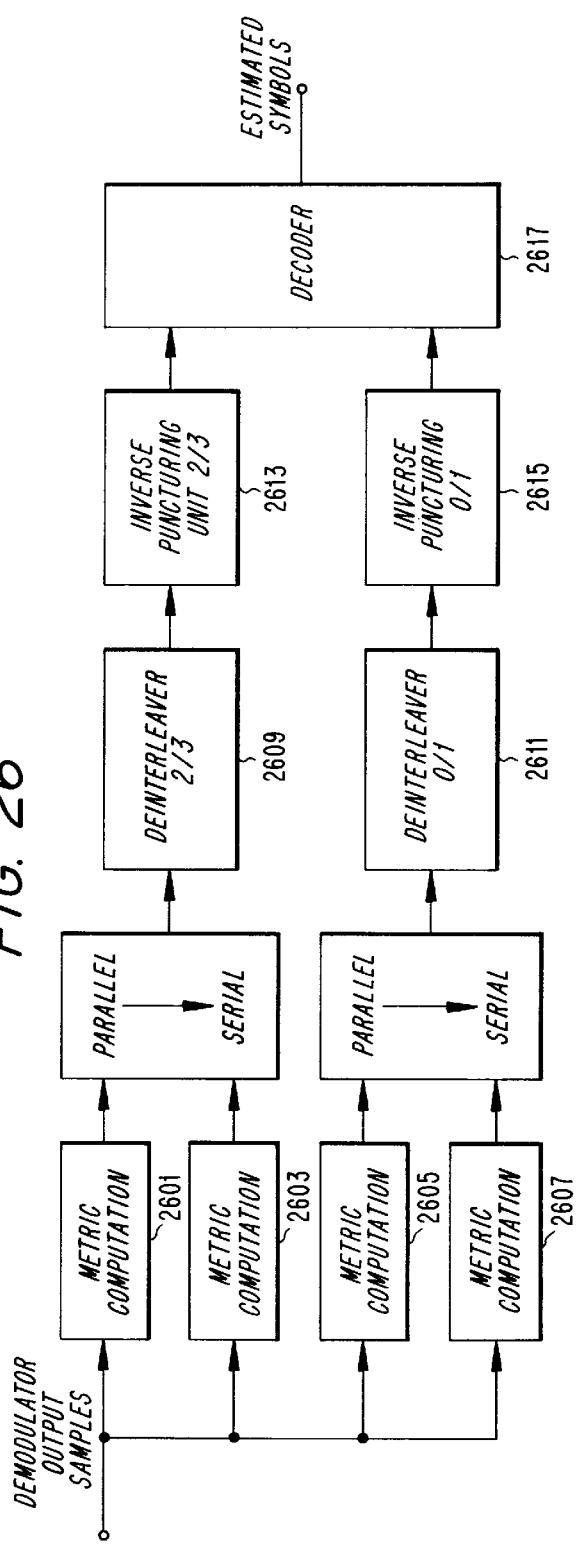
FIG. 26 illustrates an exemplary receiver for MCL coded 16QAM in accordance with one aspect of the invention.

It has already been stated that one or more codes on the classes of levels of a MCL coding scheme as shown in the combination of FIGS. 20 and 22 or in the combination of FIGS. 20 and 24 may be punctured convolutional codes. Another alternative embodiment of the inventive MCL also utilizes punctured convolutional coding. A transmitter and a receiver for this embodiment of MCL coding are shown in FIGS. 25 and 26, respectively, for the exemplary case of 16QAM.

In this embodiment, the separate encoders on the classes of levels in the original MCL coding scheme are replaced by the combination of an encoder 2501 (that implements a single (mother) convolutional code) and individual puncturing units 2503, 2505 on each class of levels. For the general case where any number (i.e., two or more) of puncturing units are utilized, puncturing should be different in at least two of the units. It is further noted that, for this embodiment of the invention, there is no requirement that at least one of the classes have at least two levels assigned to it. This modified MCL coding scheme with one mother code and several puncturing units has almost the same properties as the one with two separate punctured convolutional codes if the separate codes are based on the same mother code. The advantage of using only one mother code is reduced receiver complexity. The rest of the transmitter for this modified MCL coding scheme remains the same as for the original approach, and will not be described in further detail.

The corresponding receiver for the modified MCL coding based on punctured convolutional codes comprises metric computation units 2601, 2603, 2605, 2607 on each level, corresponding deinterleavers 2609, 2611 for each class, units for inverse puncturing 2613, 2615 on each class of levels, and a single decoder 2617 for decoding the mother convolutional code. Again, for the general case where any number (i.e., two or more) of inverse puncturing units are utilized, puncturing should be different in at least two of the inverse puncturing units.

In yet another alternative embodiment, the principle of MCL coding may be combined with symbol interleaving instead of bit interleaving. Furthermore, transmission based on MCL coding is possible even without any interleaving. The latter case may be advantageous for channels which do not suffer from fading.

Figure 27:
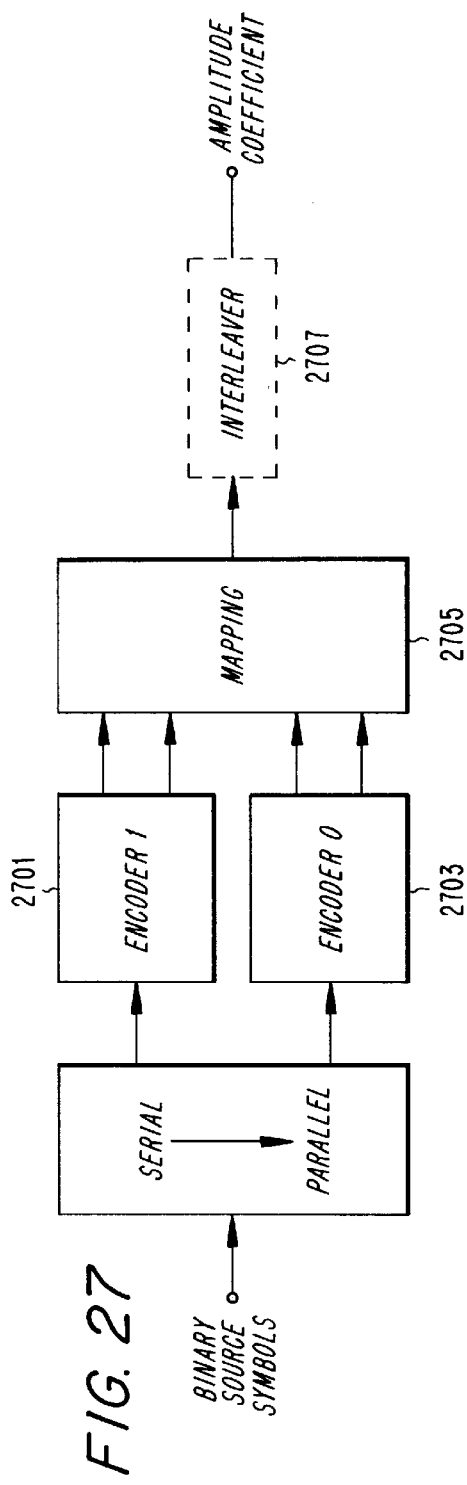
FIG. 27 depicts an exemplary transmitter for MCL coding with and without symbol interleaving in accordance with one aspect of the invention.
Figure 28:
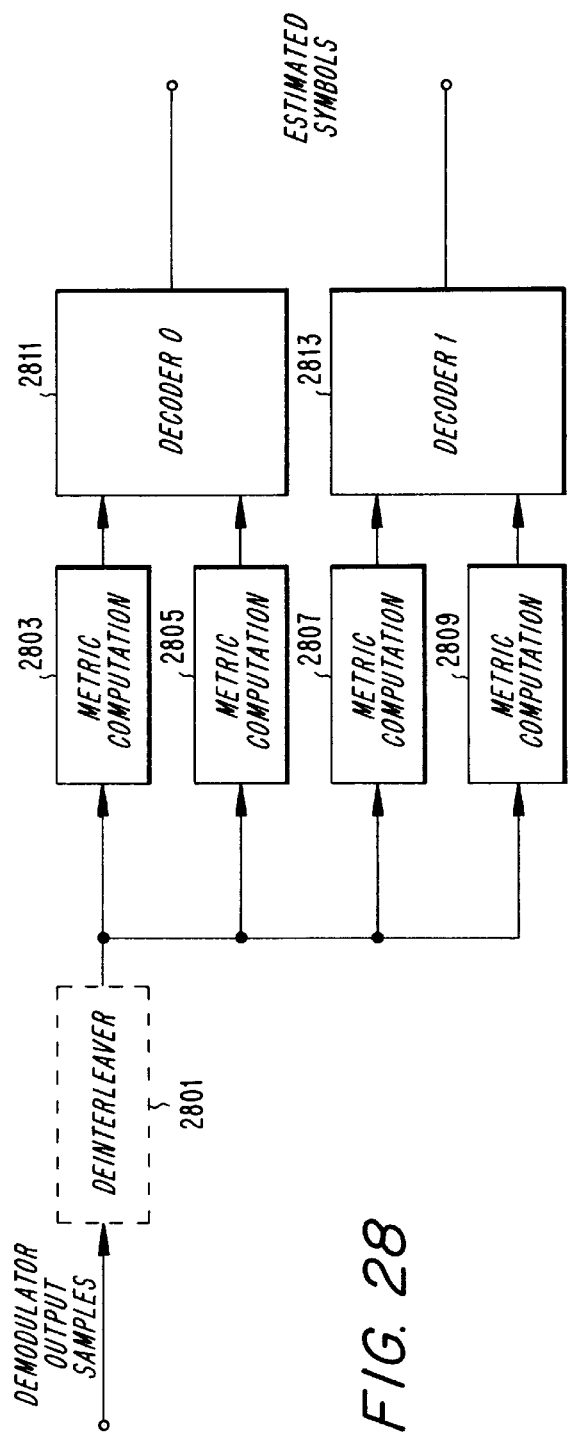
FIG. 28 depicts an exemplary receiver for MCL coding with and without symbol interleaving in accordance with one aspect of the invention.
Figure 29:
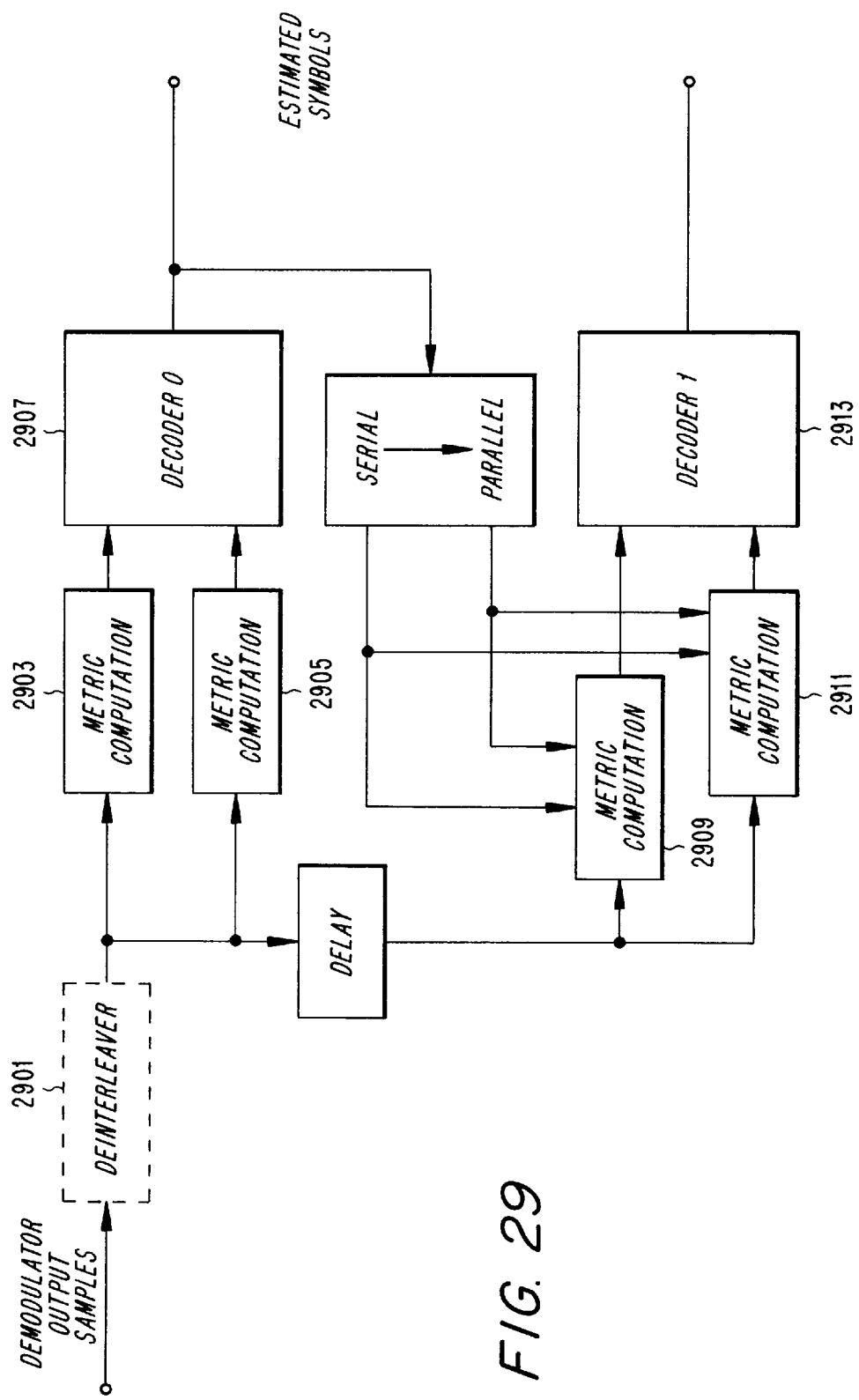
FIG. 29, depicts an exemplary receiver for MCL coding with and without symbol interleaving in accordance with another aspect of the invention.

An exemplary transmitter and possible corresponding receivers for MCL coding with symbol interleaving and without any interleaving are depicted in FIGS. 27, 28, and 29. Specifically, FIG. 27 shows a transmitter for 16QAM with channel coding based on multiple classes of levels. Two encoders 2701, 2703 supply four levels of data to a mapper 2705. A single interleaver 2707 performs a symbol interleaving operation on the output from the mapper 2705.

FIG. 28 shows a receiver without feedback for 16QAM with channel coding based on multiple classes of levels and with symbol deinterleaving. Of note is the fact that a single symbol deinterleaver 2801 works directly upon the received demodulator output samples. After deinterleaving, four metric computation units 2803, 2805, 2807, 2809 determine the metrics for each of the four levels. In accordance with the invention, the levels are grouped into several classes (in this case, two levels to each class), and the metrics for each class are supplied to a corresponding one of two decoders 2811, 2813.

As an alternative embodiment, FIG. 29 shows a receiver with feedback of estimated symbols on lower class of levels for the exemplary case of 16QAM with channel coding based on multiple classes of levels and with symbol deinterleaving. As with the receiver of FIG. 28, a single deinterleaving unit 2901 performs symbol deinterleaving directly on the demodulator output samples. After deinterleaving, estimated symbols for the first two levels are determined by two metric computation units 2903, 2905 and a first decoder 2907. The estimated symbols for these first two levels are then supplied to a next stage in the receiver, where third and fourth metric units 2909, 2911 use this information in conjunction with delayed versions of the deinterleaved filter samples to supply metrics to a second decoder 2913. Note that the decoder output signal may comprise not only hard-decided symbols but also soft-decision reliability information. Such signals may be generated by a decoder that performs maximum-a-posteriori symbol-by-symbol estimation.

FIGS. 27, 28 and 29 are also useful for illustrating a transmitter and receivers that do not utilize interleaving. In this case, the symbol interleavers and symbol deinterleavers shown in the figures are simply removed. To represent this possibility, the symbol interleavers and symbol deinterleavers in FIGS. 27, 28 and 29 are depicted by dashed-line boxes.

Figure 30:
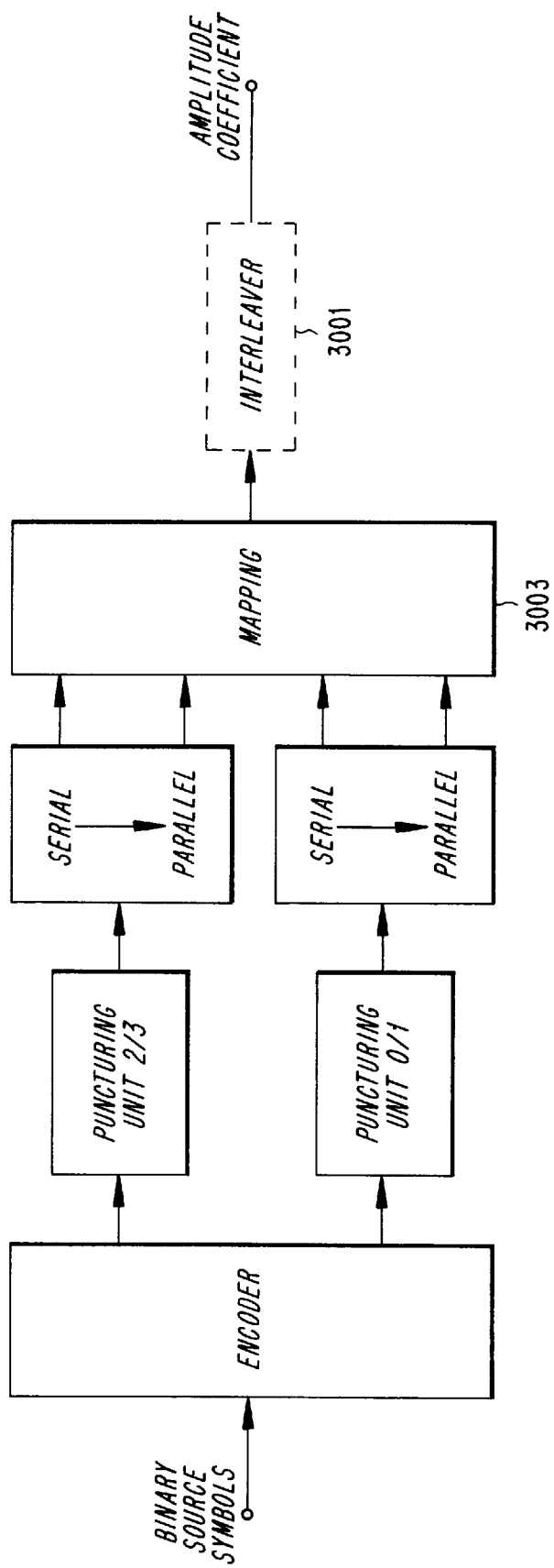
FIG. 30 depicts an exemplary transmitter for MCL coded 16QAM with and without symbol interleaving in accordance with another aspect of the invention.
Figure 31:
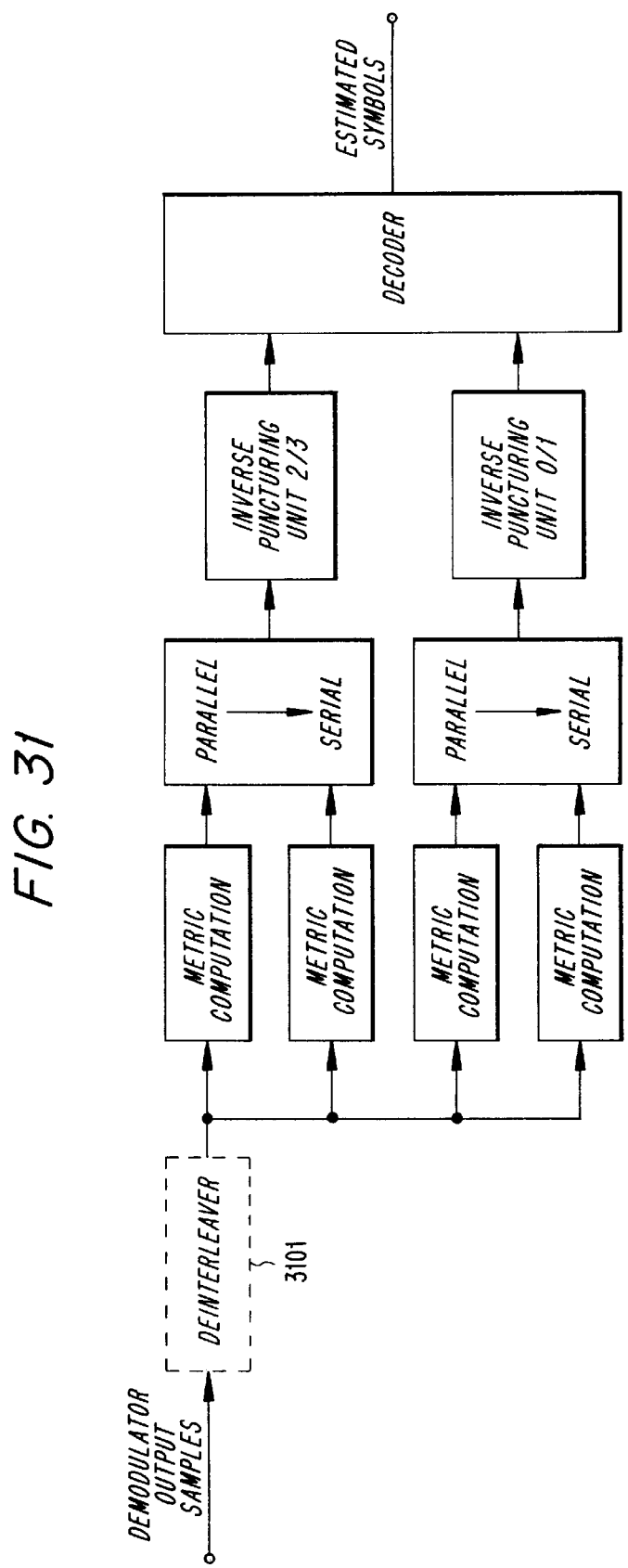
FIG. 31 depicts an exemplary receiver for MCL coded 16QAM with and without symbol interleaving in accordance with another aspect of the invention.

A modified implementation of MCL coding which is based on punctured convolutional coding with a single mother code was introduced above. It has been described in combination with bit interleaving. However, this modified MCL coding scheme may also be used in combination with symbol interleaving, and even without any interleaving. The transmitter and receiver for this scheme are depicted in FIGS. 30 and 31, respectively. Again, the interleaving and deinterleaving are optional. Therefore, the units in the figures are drawn by dashed lines.

In the transmitter depicted in FIG. 30, a single symbol interleaver 3001 appears at the output of the mapper 3003. In all other respects, the transmitter operates in accordance with principles fully described above.

In the receiver depicted in FIG. 31, a single deinterleaver 3101 operates directly on the demodulator output samples, and supplies the deinterleaved samples to the remainder of the receiver. In all other respects, the receiver operates in accordance with principles fully described above.

In the BACKGROUND section of this disclosure, it was shown that MLC with bit interleaving on each level provides superior performance over the other conventional solutions at least for transmission over fading channels.

The inventive IDL seems to be the most attractive decoding scheme for MLC if Gray mapping is applied.

The inventive MCL coding scheme for HLM provides the same performance by means of channel capacity as MLC with both MSD and IDL if Gray mapping is used. A benefit of the invention is that both transmitter and receiver for MCL coding are less complex compared to MLC because there are less encoder/decoder pairs needed for this coding scheme.

The invention has been described with reference to a particular embodiment. However, it will be readily apparent to those skilled in the art that it is possible to embody the invention in specific forms other than those of the preferred embodiment described above. This may be done without departing from the spirit of the invention. For example, in the illustrative embodiments, two classes were depicted, each with two levels assigned. There is, however, no requirement that the number of levels per class be two, or even that the number of levels assigned to each class be the same. For example, it is fully in accordance with the invention to design a 16QAM system in which there are two classes, one of which has a single encoder for three levels, and a remaining encoder for the fourth (remaining) level. Alternatively, a 16QAM system might be designed with three classes: one for encoding/decoding two levels, and the remaining two classes for encoding/decoding corresponding ones of the remaining two classes.

Furthermore, the invention is described for transmission systems based on the modulation schemes PAM, QAM and PSK. However, it will be apparent to those skilled in the art that the invention can also be used in conjunction with other modulation schemes like, for example, differential PSK.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A method of encoding a plurality of source symbols for use in a higher level modulator, the method comprising the steps of:

partitioning the source symbols into a number of classes;

providing a corresponding encoder for each of the classes, and for each class, supplying each of the source symbols to the corresponding encoder;

for each encoder, supplying coded symbols at an encoder output and partitioning the coded symbols into a number of levels associated with the corresponding class, wherein at least one of the classes has at least two levels associated with it; and supplying the partitioned coded symbols to a mapper that generates amplitude coefficient signals.

2. The method of claim 1, wherein the step of supplying the partitioned coded symbols to a mapper that generates amplitude coefficient signals comprises the steps of:

for each encoder, supplying the coded symbols to a corresponding interleaver; and for each corresponding interleaver, supplying interleaved coded symbols at an output of the interleaver, partitioning the interleaved coded symbols into the number of levels associated with the corresponding class, and supplying the partitioned interleaved coded symbols to the mapper that generates amplitude coefficient signals.

3. The method of claim 2, wherein at least one of the encoders performs convolutional encoding.

4. The method of claim 3, wherein the mapper performs Gray mapping.

5. The method of claim 1, further comprising the step of:

supplying the amplitude coefficient signals to an interleaver that performs symbol interleaving.

6. A method of decoding a plurality of source symbols that have been modulated in a higher level modulator, the method comprising the steps of:

receiving demodulator output samples;

providing a number of metric computation units in correspondence with a number of levels;

assigning each level to one of a number of classes;

supplying the demodulator output samples to each of the metric computation units and generating computed metric signals at an output of each metric computation unit;

providing a corresponding decoder for each class; and supplying the computed metric signals from each of the metric computation units to the corresponding decoder, and generating decoded source symbols.

7. The method of claim 6, wherein at least one of the classes has at least two levels assigned to it.

8. The method of claim 7, wherein the step of supplying the computed metric signals from each of the metric computation units to the corresponding decoder comprises the steps of:

supplying a number of deinterleavers in correspondence with the number of classes, and associating each deinterleaver with a corresponding class;

associating each of the metric computation units with one of the deinterleavers so that the metric computation unit's level is assigned to the associated deinterleaver's corresponding class;

for each of the metric computation units, supplying the computed metric signals to the associated deinterleaver; and for each deinterleaver, generating deinterleaved computed metric signals at an output of the deinterleaver, and supplying the deinterleaved computed metric signals to the corresponding decoder, and generating decoded source symbols.

9. The method of claim 8, wherein at least one of the decoders performs convolutional decoding.

10. The method of claim 6, wherein the step of supplying the computed metric signals from each of the metric computation units to the corresponding decoder comprises the steps of:

supplying a number of deinterleavers in correspondence with the number of classes, and associating each deinterleaver with a corresponding class;

associating each of the metric computation units with one of the deinterleavers so that the metric computation unit's level is assigned to the associated deinterleaver's corresponding class;

for each of the metric computation units, supplying the computed metric signals to the associated deinterleaver; and for each deinterleaver, generating deinterleaved computed metric signals at an output of the deinterleaver, and supplying the deinterleaved computed metric signals to the corresponding decoder, and generating decoded source symbols.

11. The method of claim 10, wherein each deinterleaver is a main deinterleaver that comprises a number of other deinterleavers in correspondence with the number of levels associated with the main deinterleaver's corresponding class.

12. The method of claim 6, wherein the step of supplying the demodulator output samples to each of the metric computation units and generating computed metric signals at an output of each metric computation unit comprises the steps of:

supplying the demodulator output samples to a deinterleaver that performs symbol deinterleaving; and supplying the deinterleaved demodulator output samples to each of the metric computation units and generating computed metric signals at an output of each metric computation unit.

13. A method of decoding a plurality of source symbols that have been modulated in a higher level modulator, the method comprising the steps of:

receiving demodulator output samples;

providing a number of metric computation units in correspondence with a number of levels;

assigning each level to one of a number of classes, wherein at least one of the classes has at least two levels assigned to it;

for a first class, supplying the demodulator output samples to each of the corresponding metric computation units and generating computed metric signals at an output of each corresponding metric computation unit;

providing a corresponding decoder for each class;

for the first class, supplying the computed metric signals from each of the corresponding metric computation units to the corresponding decoder, and generating a first set of decoded source symbols;

for a second class, supplying delayed demodulator output samples and the first set of decoded source symbols to each of the corresponding metric computation units and generating computed metric signals at an output of each corresponding metric computation unit;

for the second class, supplying the computed metric signals from each of the corresponding metric computation units to the corresponding decoder, and generating a second set of decoded source symbols.

14. The method of claim 13, wherein:

the step of, for the first class, supplying the demodulator output samples to each of the corresponding metric computation units and generating computed metric signals at an output of each corresponding metric computation unit comprises the steps of:

supplying a first deinterleaver and associating the first deinterleaver with the first class;

for each of the corresponding metric computation units, supplying the computed metric signals to the first deinterleaver; and generating deinterleaved computed metric signals at an output of the first deinterleaver, and supplying the deinterleaved computed metric signals to the corresponding decoder, and generating a first set of decoded source symbols;

the step of, for the second class, supplying delayed demodulator output samples and the first set of decoded source symbols to each of the corresponding metric computation units and generating computed metric signals at an output of each corresponding metric computation unit comprises the steps of:

supplying the first set of decoded source symbols to a corresponding interleaving unit to generate a first set of interleaved decoded source symbols;

supplying the delayed demodulator output samples and the first set of interleaved decoded source symbols to each of the corresponding metric computation units and generating computed metric signals at an output of each corresponding metric computation unit; and the step of, for the second class, supplying the computed metric signals from each of the corresponding metric computation units to the corresponding decoder, and generating a second set of decoded source symbols comprises the steps of:

supplying a second deinterleaver and associating the second deinterleaver with the second class;

supplying the computed metric signals from each of the corresponding metric computation units to the second deinterleaver; and generating deinterleaved computed metric signals at an output of the second deinterleaver, and supplying the deinterleaved computed metric signals to the corresponding decoder, and generating a second set of decoded source symbols.

15. The method of claim 14, wherein at least one of the decoders performs convolutional decoding.

16. The method of claim 14, wherein each of the first and second deinterleavers is a main deinterleaver that comprises a number of other deinterleavers in correspondence with the number of levels associated with the main deinterleaver's corresponding class.

17. The method of claim 13, wherein the step of receiving demodulator output samples comprises the steps of:

receiving interleaved demodulator output samples; and supplying the interleaved demodulator output samples to a deinterleaver that performs symbol deinterleaving, and generating the demodulator output samples at an output of the deinterleaver.

18. A method of encoding a plurality of source symbols for use in a higher level modulator, the method comprising the steps of:

supplying the source symbols to an encoder;

partitioning the encoded symbols into a number of classes;

providing a corresponding puncturing unit for each of the classes, and for each class, supplying each of the source symbols to the corresponding puncturing unit, wherein puncturing is different in at least two of the puncturing units;

for each puncturing unit, supplying punctured coded symbols at a puncturing unit output and partitioning the punctured coded symbols into a number of levels associated with the corresponding class; and supplying the partitioned punctured coded symbols to a mapper that generates amplitude coefficient signals.

19. The method of claim 18, wherein the step of supplying the partitioned punctured coded symbols to the mapper that generates amplitude coefficient signals comprises the steps of:

for each puncturing unit, supplying the punctured coded symbols to a corresponding interleaver; and for each corresponding interleaver, supplying interleaved punctured coded symbols at an output of the interleaver, partitioning the interleaved punctured coded symbols into the number of levels associated with the corresponding class, and supplying the partitioned interleaved punctured coded symbols to the mapper that generates amplitude coefficient signals.

20. The method of claim 18, further comprising the step of:

supplying the amplitude coefficient signals to an interleaver that performs symbol interleaving.

21. A method of decoding a plurality of source symbols that have been modulated in a higher level modulator, the method comprising the steps of:

receiving demodulator output samples;

providing a number of metric computation units in correspondence with a number of levels;

assigning each level to one of a number of classes;

supplying the demodulator output samples to each of the metric computation units and generating computed metric signals at an output of each metric computation unit; and providing a corresponding inverse puncturing unit for each class, wherein puncturing is different in at least two of the inverse puncturing units;

supplying the computed metric signals from each of the metric computation units to the corresponding inverse puncturing unit, and generating inverse punctured metric signals; and supplying the inverse punctured metric signals from each of the inverse puncturing units to a single decoder.

22. The method of claim 21, wherein the step of supplying the computed metric signals from each of the metric computation units to the corresponding inverse puncturing unit comprises the steps of:

providing a corresponding deinterleaver for each of the classes;

for each of the metric computation units, supplying the computed metric signals to the corresponding deinterleaver; and for each corresponding deinterleaver, supplying deinterleaved computed metric signals at an output of the deinterleaver, and supplying the deinterleaved computed metric signals to the corresponding inverse puncturing unit.

23. The method of claim 21, wherein the step of supplying the demodulator output samples to each of the metric computation units and generating computed metric signals at an output of each metric computation unit comprises the steps of:

supplying the demodulator output samples to a deinterleaver that performs symbol deinterleaving; and supplying the deinterleaved demodulator output samples to each of the metric computation units and generating computed metric signals at an output of each metric computation unit.

24. An apparatus for encoding a plurality of source symbols for use in a higher level modulator, the apparatus comprising:

means for partitioning the source symbols into a number of classes;

a plurality of encoders in correspondence with the number of classes, wherein:

each encoder is coupled to receive each of the source symbols for the corresponding class; and each encoder supplies coded symbols at an encoder output;

for each encoder, means for partitioning the coded symbols into a number of levels associated with the corresponding class, wherein at least one of the classes has at least two levels associated with it; and a mapper, coupled to receive the partitioned coded symbols, for generating amplitude coefficient signals.

25. The apparatus of claim 24, wherein further comprising:

for each encoder, a corresponding interleaver coupled to receive the coded symbols from the encoder, wherein each interleaver supplies interleaved coded symbols at an output of the interleaver; and for each corresponding interleaver, means for partitioning the interleaved coded symbols into the number of levels associated with the corresponding class, and supplying the partitioned interleaved coded symbols to the mapper that generates amplitude coefficient signals.

26. The apparatus of claim 24, further comprising:

means, coupled to receive the amplitude coefficient signals, for performing symbol interleaving.

27. An apparatus for decoding a plurality of source symbols that have been modulated in a higher level modulator, the apparatus comprising:

means for receiving demodulator output samples;

a plurality of metric computation units in correspondence with a number of levels, wherein each level is assigned to one of a number of classes and wherein each of the metric computation units receives the demodulator output samples and generates computed metric signals at an output of the metric computation unit; and a plurality of decoders in correspondence with the number of classes, wherein each decoder receives the computed metric signals from the corresponding metric computation unit and generates therefrom decoded source symbols.

28. The apparatus of claim 27, wherein at least one of the classes has at least two levels assigned to it.

29. The apparatus of claim 28, further comprising:

a number of deinterleavers in correspondence with the number of classes, wherein each deinterleaver is associated with a corresponding class, and wherein:

each of the metric computation units is associated with one of the deinterleavers so that the metric computation unit's level is assigned to the associated deinterleaver's corresponding class;

for each of the metric computation units, the computed metric signals are supplied to the associated deinterleaver; and for each deinterleaver, deinterleaved computed metric signals are generated at an output of the deinterleaver, and the deinterleaved computed metric signals are supplied to the corresponding decoder that generates decoded source symbols.

30. The apparatus of claim 27, further comprising:

a number of deinterleavers in correspondence with the number of classes, wherein each deinterleaver is associated with a corresponding class, wherein:

each of the metric computation units is associated with one of the deinterleavers so that the metric computation unit's level is assigned to the associated deinterleaver's corresponding class;

for each of the metric computation units, the computed metric signals are supplied to the associated deinterleaver; and for each deinterleaver, deinterleaved computed metric signals are generated at an output of the deinterleaver, and the deinterleaved computed metric signals are supplied to the corresponding decoder that generates decoded source symbols.

31. The apparatus of claim 30, wherein each deinterleaver is a main deinterleaver that comprises a number of other deinterleavers in correspondence with the number of levels associated with the main deinterleaver's corresponding class.

32. The apparatus of claim 27, further comprising:

a symbol deinterleaving unit, coupled to receive the demodulator output samples, for generating deinterleaved demodulator output samples, wherein:

the deinterleaved demodulator output samples are supplied to each of the metric computation units that generate therefrom the computed metric signals at the output of each metric computation unit.

33. An apparatus for decoding a plurality of source symbols that have been modulated in a higher level modulator, the apparatus comprising:

means for receiving demodulator output samples;

a number of metric computation units in correspondence with a number of levels, wherein each level is assigned to one of a number of classes, and wherein at least one of the classes has at least two levels assigned to it;

a plurality of decoders, each in correspondence with one of the classes; and delaying means, coupled to receive the demodulator output samples, for generating delayed demodulator output samples, wherein:

for a first class, the demodulator output samples are supplied to each of the corresponding metric computation units that generate computed metric signals at an output of each corresponding metric computation unit;

for the first class, the computed metric signals are supplied from each of the corresponding metric computation units to the corresponding decoder, and generating a first set of decoded source symbols;

for a second class, the delayed demodulator output samples and the first set of decoded source symbols are supplied to each of the corresponding metric computation units that generate computed metric signals at an output of each corresponding metric computation unit; and for the second class, the computed metric signals are supplied from each of the corresponding metric computation units to the corresponding decoder that generates a second set of decoded source symbols.

34. The apparatus of claim 33, further comprising:

a first deinterleaver that is associated with the first class;

an interleaving unit, coupled to receive the first set of decoded source symbols, for generating a first set of interleaved decoded source symbols; and a second deinterleaver that is associated with the second class, wherein:

for the first class:

the computed metric signals from each of the corresponding metric computation units are supplied to the first deinterleaver;

the first deinterleaver generates deinterleaved computed metric signals at an output of the first deinterleaver; and the deinterleaved computed metric signals are supplied to the corresponding decoder that generates the first set of decoded source symbols;

the first set of decoded source symbols are supplied to the interleaving unit to generate a first set of interleaved decoded source symbols; and for the second class:

the delayed demodulator output samples and the first set of interleaved decoded source symbols are supplied to each of the corresponding metric computation units that generate computed metric signals at an output of each corresponding metric computation unit;

the computed metric signals are supplied from each of the corresponding metric computation units to the second deinterleaver; and deinterleaved computed metric signals are generated at an output of the second deinterleaver, and the deinterleaved computed metric signals are supplied to the corresponding decoder that generates the second set of decoded source symbols.

35. The apparatus of claim 34, wherein each of the first and second deinterleavers is a main deinterleaver that comprises a number of other deinterleavers in correspondence with the number of levels associated with the main deinterleaver's corresponding class.

36. The apparatus of claim 33, further comprising:

a deinterleaver that performs symbol deinterleaving, and wherein:

the received demodulator output samples are received interleaved demodulator output samples;

the interleaved demodulator output samples are supplied to the deinterleaver that performs symbol deinterleaving; and the output of the deinterleaver is supplied to the first class corresponding metric computation units and to the delaying means.

37. An apparatus for encoding a plurality of source symbols for use in a higher level modulator, the apparatus comprising:

an encoder, coupled to receive the source symbols, wherein the encoder generates encoded symbols;

means for partitioning the encoded symbols into a number of classes;

a plurality of puncturing units, each in correspondence with one of the classes, wherein for each class, each of the source symbols is supplied to the corresponding puncturing unit, wherein for each puncturing unit:
punctured coded symbols are supplied at a puncturing unit output;
puncturing is different in at least two of the puncturing units; and
the punctured coded symbols are partitioned into a number of levels associated with the corresponding class; and a mapper, coupled to receive the partitioned punctured coded symbols, for generating amplitude coefficient signals.

38. The apparatus of claim 37, further comprising:

a plurality of interleavers in correspondence with the plurality of puncturing units, wherein:
for each puncturing unit, the punctured coded symbols are supplied to a corresponding one of the interleavers; and
for each corresponding interleaver, interleaved punctured coded symbols are supplied at an output of the interleaver, the interleaved punctured coded symbols are partitioned into the number of levels associated with the corresponding class, and the partitioned interleaved punctured coded symbols are supplied to the mapper that generates amplitude coefficient signals.

39. The apparatus of claim 37, further comprising an interleaver, coupled to receive the amplitude coefficient signals, for performing symbol interleaving.

40. An apparatus for decoding a plurality of source symbols that have been modulated in a higher level modulator, the apparatus comprising:

means for receiving demodulator output samples;

a number of metric computation units in correspondence with a number of levels, wherein:

each level is assigned to one of a number of classes;
the demodulator output samples are supplied to each of the metric computation units; and
computed metric signals are generated at an output of each metric computation unit;

a plurality of inverse puncturing units in correspondence with the number of classes, wherein:
the computed metric signals from each of the metric computation units are supplied to the corresponding inverse puncturing unit;
puncturing is different in at least two of the inverse puncturing units; and
the inverse puncturing units generate inverse punctured metric signals; and a single decoder, coupled to receive the inverse punctured metric signals from each of the inverse puncturing units.

41. The apparatus of claim 40, further comprising:

a plurality of deinterleavers in correspondence with the number of classes, wherein:
for each of the metric computation units, the computed metric signals are supplied to the corresponding deinterleaver;
for each corresponding deinterleaver, deinterleaved computed metric signals are supplied at an output of the deinterleaver; and the deinterleaved computed metric signals are supplied to the corresponding inverse puncturing unit.

42. The apparatus of claim 40, further comprising:

a deinterleaver that performs symbol deinterleaving, wherein:
the deinterleaver is coupled to receive the demodulator output samples;
the deinterleaved demodulator output samples are supplied to each of the metric computation units; and
computed metric signals are generated at an output of each metric computation unit.

* * * * *